(12) United States Patent
Kitamura

(10) Patent No.: US 6,465,295 B1
(45) Date of Patent: Oct. 15, 2002

(54) METHOD OF FABRICATING A SEMICONDUCTOR DEVICE

(75) Inventor: Kenji Kitamura, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 08/620,928

(22) Filed: Mar. 22, 1996

(30) Foreign Application Priority Data

| Mar. 24, 1995 | (JP) | ............................................. | 7-066403 |
| Jun. 2, 1995 | (JP) | ............................................. | 7-136963 |
| Nov. 22, 1995 | (JP) | ............................................. | 7-304781 |

(51) Int. Cl.[7] ......................................... H01L 21/8238
(52) U.S. Cl. ..................... 438/231; 438/199; 438/305; 438/592
(58) Field of Search ................................ 438/303, 305, 438/306, 307, 217, 223, 224, 227, 228, 231, 232, FOR 168, 199, 592

(56) References Cited

U.S. PATENT DOCUMENTS

| 4,555,842 A | * | 12/1985 | Levinstein et al. | ......... | 438/592 |
| 5,285,102 A | * | 2/1994 | Ying | ......................... | 257/638 |
| 5,439,831 A | * | 8/1995 | Schwalke et al. | ........... | 438/305 |

* cited by examiner

Primary Examiner—Michael Trinh
(74) Attorney, Agent, or Firm—Adams & Wilks

(57) ABSTRACT

A semiconductor device fabrication method comprises the steps of forming a gate insulating film on a surface of a semiconductor substrate, forming a polysilicon film on the gate insulating film, and implanting B or $BF_2$ impurity ions into the polysilicon film. The polysilicon film is then heat-treated at a temperature of 700–900° C. to activate and diffuse the implanted B or $BF_2$ impurity ions. Thereafter, a silicide film is formed on the heat-treated polysilicon film. The silicide film and the heat-treated polysilicon film are then etched to form a gate electrode on the gate insulating film. A CVD-grown dielectric film having a thickness of 5 to 1000 Å is then formed over the whole surface of the semiconductor substrate and the gate electrode. B or $BF_2$ impurity ions are then implanted into the surface of the semiconductor substrate, using the gate electrode as a mask, to form source/drain regions. A BPSG interlayer film is then formed on the CVD-grown dielectric film, and the source/drain regions and the BPSG interlayer film are heated at a temperature of 800–1050° C. for a period less than 3 minutes to activate the source/drain regions and to planarize the BPSG interlayer film.

14 Claims, 21 Drawing Sheets

PRIORART
FIG. 2
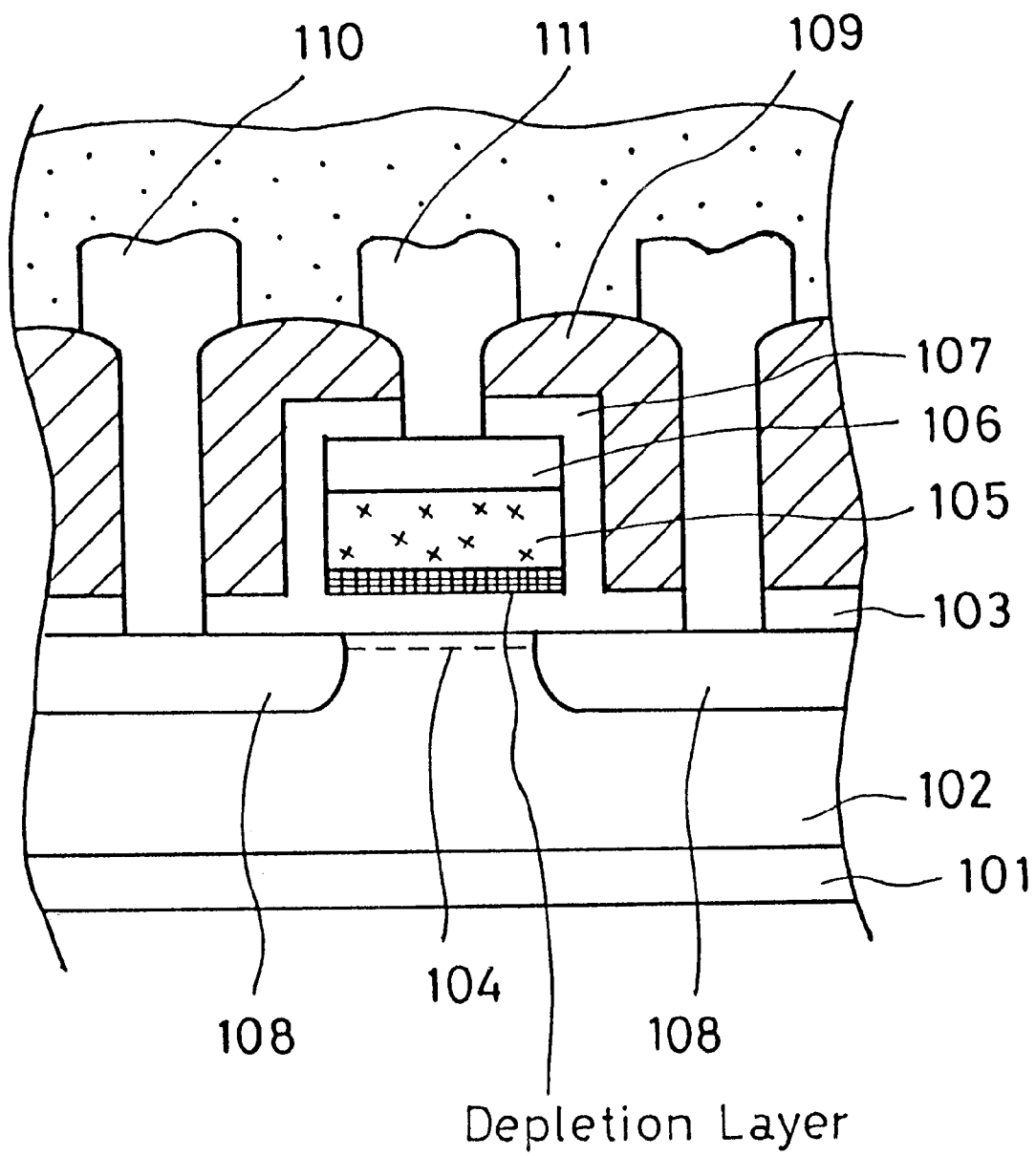

C-V CHARACTERISTICS

BORON IMPLANT CONCENTRATION ( atom/cm³ )

×—× Boron (/cm³)
○—○ Phosphous (/cm³)
+—+ Net Doping (/cm³)

Distance

×—× Boron (/cm³)
○—○ Arsenic (/cm³)
+—+ Net Doping (/cm³)

Distance

F I G. 17A
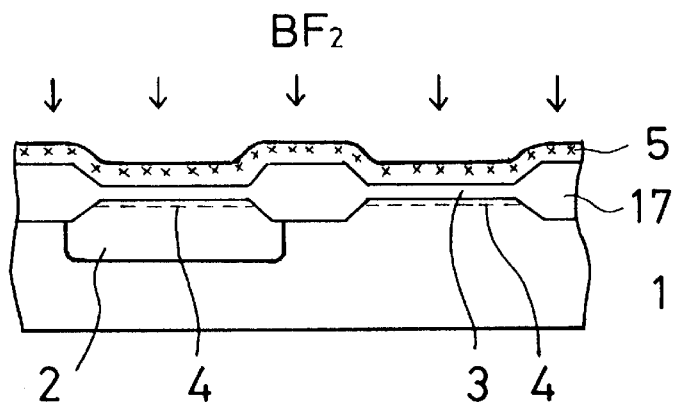
F I G. 17B
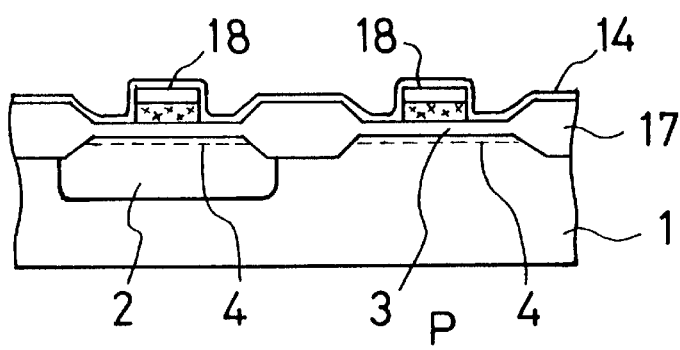
F I G. 17C
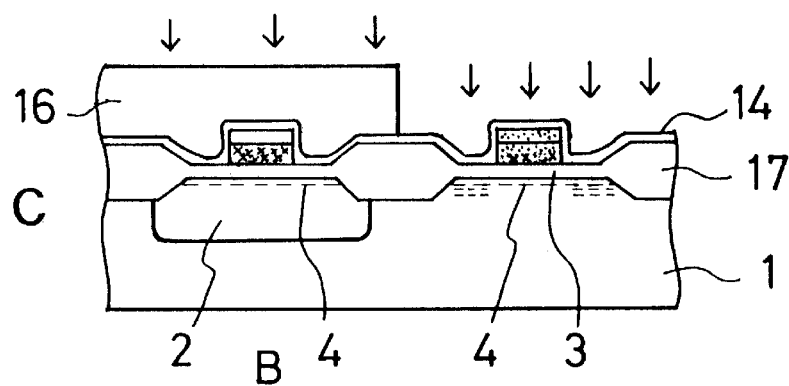
F I G. 17D
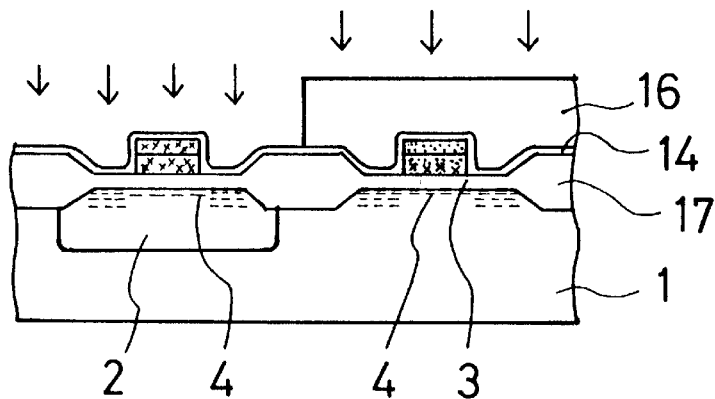

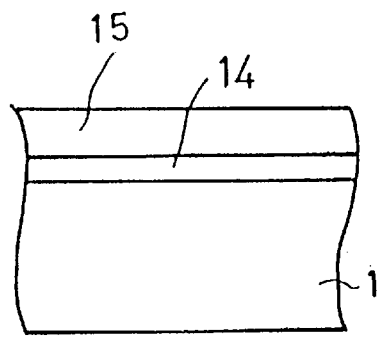
F I G. 1 8 A
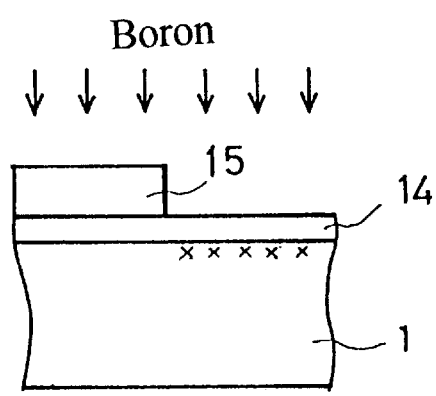
F I G. 1 8 B
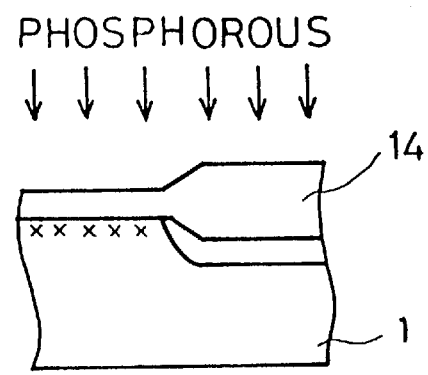
F I G. 1 8 C
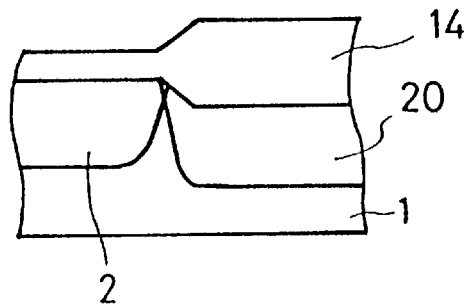
F I G. 1 8 D

METHOD OF FABRICATING A SEMICONDUCTOR DEVICE

BACKGROUND OF THE INVENTION

The present invention relates to a field-effect semiconductor device capable of operating at a low voltage and also to a method of fabricating it.

FIG. 2 shows a final cross-sectional view of a semiconductor device fabricated by the prior art fabrication method. A semiconductor substrate surface 102 has N-type semiconductor regions over which a gate-insulating film 103 is formed by thermal oxidation processing. A channel implant 104 is made into the N-type semiconductor regions through the gate-insulating film. A thin film of silicon 105 is deposited on the gate-insulating film by a CVD method. Boron ions are implanted as P-type impurities, and then the laminate is heat-treated to make the thin silicon film P-type. Thereafter, a silicide film 106 is deposited on the polysilicon thin film. Photoresist is patterned. The silicon thin film and the silicide film are etched at the same timing, thus forming gate electrodes. Then, the surface of the semiconductor substrate is thermally oxidized to form an oxide film. Subsequently, impurity ions are implanted, using the gate electrodes as a mask. In this way, source/drain regions 108 are formed. This is followed by formation of an interlayer film 109 of BPSG over the whole surface. For example, this interlayer film is formed by CVD or other method, followed by a heat treatment for planarizing the surface. Then, the interlayer film is selectively etched and heat-treated. Contact holes communicating with the source/drain regions and with the gate electrodes are formed. Then, a metallic material or the like is formed as a film over the whole surface by vacuum evaporation, sputtering, or other method. Thereafter, photolithography and etching steps are carried out. In this manner, a metal interconnect pattern 110 is formed. Finally, the whole substrate is protected with a surface-protecting film.

Portable appliances and desktop appliances normally use electric batteries as their power supplies. In order to achieve miniaturization of the appliances and lower electric power consumption, appliances which are required to be operated at a power voltage (about 1.5 V) supplied from a single dry battery are increasingly produced. Accordingly, low-voltage operation ICs are cited as important items to be developed.

In order to lower the operating voltage, it is necessary to suppress the threshold voltage of the MOS transistor. However, where the threshold voltage of the MOS transistor is decreased down to a value (e.g., about 0.5 V) which is necessary for 1.5 V-operation, there arises the problem that the leakage current from the MOS transistor increases. If the leakage current increases, the electric battery is consumed quickly even if the battery-driven portable appliance is not used. As a result, the battery runs down prematurely.

With the above-described semiconductor fabrication method, however, before the implantation of ions into the source/drain regions, the oxide film is formed by thermal oxidation and so the process temperature is high. P-type boron in the polvsilicon diffuses into the silicide film, thus reducing the concentration in the polysilicon. In the field-effect transistor having the gate electrode of this construction, a depletion layer is formed within the gate electrode. Therefore, the threshold voltage varies, the channel conductance decreases, and the leakage current increases.

SUMMARY OF THE INVENTION

In order to solve the foregoing problems, the following fabrication means are taken.

(1) A gate-insulating film is formed on a surface of a semiconductor substrate. A gate electrode is formed on the gate-insulating film to make a pattern. A CVD-grown dielectric film having a thickness of 5 to 1000 Å is formed at a temperature lower than 850° C. over the whole surface of the semiconductor substrate. Impurity ions are implanted into the surface of the semiconductor substrate, using the gate electrode as a mask. Thus, source/drain regions are formed.

(2) The aforementioned gate electrode is formed in the manner described now. A thin film of silicon is formed on the gate-insulating film. P-type impurity ions are implanted into the thin film of silicon. The semiconductor substrate is heat-treated at a temperature of 700–900° C. to make the silicon film P-type. A silicide film is formed on the silicon film.

(3) The source/drain regions are heat-treated at a temperature of 800 to 1050° C. for a short time of less than 3 minutes to activate them.

(4) A method of fabricating a semiconductor device having N-type semiconductor regions and P-type semiconductor regions formed on a surface of a semiconductor substrate, P-type insulated-gate field-effect transistors and N-type insulated-gate field-effect transistors installed in the N- and P-type semiconductor regions, respectively, at a high integration density, said method comprising the steps of:

forming a gate-insulating film on the surface of said semiconductor substrate;

forming a thin film of silicon on said gate-insulating film;

implanting P-type impurity ions into the thin film of silicon overlying said N-type semiconductor regions;

implanting N-type impurity ions into the thin film of silicon overlying said P-type semiconductor regions;

heat-treating said semiconductor substrate at a temperature of 700–900° C. to make said thin films of silicon P-type and N-type, respectively;

forming a silicide film on said thin films of silicon;

selectively etching said thin films of silicon and said silicide film at the same time to form gate electrodes on said gate-insulating film;

forming a CVD-grown dielectric film having a thickness of 5 to 1000 Å over the whole surface of the semiconductor substrate;

implanting P-type impurity ions into surfaces of said N-type semiconductor regions while using said gate electrodes as a mask, thus forming source/drain regions; and implanting N-type impurity phosphorus ions into surfaces of said P-type semiconductor regions while using said gate electrodes as a mask, thus forming source/drain regions.

(5) The steps of forming said source/drain regions are carried out by activation which is performed by a heat treatment that is conducted at a temperature of 800–1050° C. within a short time of less than 3 minutes.

(6) One comprising:

a gate-insulating film formed on a semiconductor substrate;

gate electrodes consisting of P- and N-type polysilicon thin films and plural thin conductive films formed over said gate-insulating film;

source and drain regions which are formed over a surface of said semiconductor regions on opposite sides of said gate electrodes and spaced from each other; and said P- and N-type polysilicon thin films being doped with impurities at an impurity concentration sufficient to prevent depletion layers from being formed in said P- and N-type polysilicon thin films when a voltage is applied between each of the conductive thin films and said semiconductor substrate.

(7) Said P-type polysilicon thin film is doped with a P-type impurity at a concentration in excess of 2E19 atoms/cm³. Said N-type polysilicon thin film is doped with an N-type impurity at a concentration in excess of 2E19 atoms/cm³.

(8) A method of fabricating a CMOS semiconductor device having N-type and P-type semiconductor regions formed on a surface of the semiconductor substrate and N-type and P-type gate-insulated field-effect transistors installed in the P- and N-type semiconductor regions, respectively, at a high integration density, said method comprising the steps of:

forming a gate-insulating film on the surface of said semiconductor substrate;

implanting N-type impurity ions into the surfaces of said N-type semiconductor regions to form channel doped regions;

implanting P-type impurity ions into the surfaces of said P-type semiconductor regions to form channel doped regions;

forming a thin film of silicon on said gate-insulating film;

implanting P-type impurity ions into the thin film of silicon overlying said N-type semiconductor regions;

implanting N-type impurity ions into the thin film of silicon overlying said P-type semiconductor regions;

heat-treating said semiconductor substrate at a temperature of 700–900° C. to make said silicon thin films P-type and N-type, respectively;

forming a silicide film on said silicon films;

selectively etching said silicon films and said silicide film at the same time to form gate electrodes over the gate-insulating film;

forming a CVD-grown dielectric film having a thickness of 5 to 1000 Å over the whole surface of said semiconductor substrate;

implanting P-type impurity ions into the surfaces of said N-type semiconductor regions, using said gate electrodes as a mask, to form source/drain regions;

implanting N-type impurity phosphorus ions into the surfaces of said P-type semiconductor regions, using said gate electrodes as a mask, to form source/drain regions; and heat-treating said source/drain regions at a temperature of 800 to 1050° C. for a short time of less than 3 minutes so as to activate the source/drain regions, whereby completing them.

(9) During said step of forming said channel doped regions, phosphorus or arsenic ions are implanted as the N-type impurity ions at an acceleration energy of less than 30 KeV or less than 70 KeV, respectively. $BF_2$ is implanted as the P-type impurity ions at an acceleration energy of less than 70 KeV.

(10) During said step of forming said channel doped regions, $BF_2$ ions are implanted as the P-type impurity ions into the whole surface of the semiconductor substrate and then phosphorus ions are implanted as the N-type impurity ions into the surfaces of said N-type semiconductor regions, thus forming the channel doped regions.

(11) A method of fabricating said CMOS semiconductor device, comprising the steps of:

forming a thin film of silicon on said gate-insulating film;

implanting P-type impurity ions into said thin film of silicon;

heat-treating said semiconductor substrate at a temperature of 700–900° C. to make said thin film of silicon P-type;

forming a silicide film on said thin film of silicon;

selectively etching said thin film of silicon and said silicide film at the same time to form gate electrodes on the gate-insulating film;

heat-treating the whole surface of said semiconductor substrate at a temperature of 800–1050° C. in an oxygen ambient for a short time of less than 3 minutes to form a dielectric film over the whole surface;

implanting N-type impurity ions into surfaces of said P-type semiconductor regions, using said gate electrodes as a mask, to form source/drain region and, at the same time, implanting ions into said silicide film;

implanting P-type impurity ions into surfaces of said N-type semiconductor regions, using said gate electrodes as a mask, to form source/drain regions; and heat-treating said source/drain regions at a temperature of 800–1050° C. for a short time of less than 3 minutes to activate the source/drain regions and, at the same time, diffusing an N-type impurity from said ion-implanted silicide film into said thin films of silicon under the silicide film to change said P-type thin films of silicon on the surfaces of said semiconductor regions into N-type thin films of silicon.

(12) A semiconductor device having said P- and N-type gate-insulated field-effect transistors installed at a high integration density in said N- and P-type semiconductor regions, respectively, formed on the surface of the semiconductor substrate. A gate-insulating film of 30 to 200 Å is formed on the surface of the semiconductor substrate. The gate electrodes formed on said gate-insulating film has a minimum length of 1.0 $\mu$m.

(13) A method of fabricating a semiconductor, comprising the steps of:

forming a P-type well layer in a semiconductor substrate, using a mask; and then forming an N-type well layer in the semiconductor substrate.

(14) A method comprising the steps of:

forming a silicon oxide film and a silicon nitrite film on a semiconductor substrate successively;

selectively removing said silicon nitrite film by photomask processing to define regions of said P well layer;

implanting P-type impurity ions into said semiconductor substrate;

forming a silicon oxide film in the P well regions from which said silicon nitrite film has been removed;

removing said silicon nitrite film to define regions of said N well layer;

implanting N-type impurity ions into said semiconductor substrate; and heat-treating said semiconductor substrate to diffuse and activate the impurities.

BRIEF DESCRIPTION OF THE DRAWINGS

FIG. 2 is a final cross-sectional view, illustrating the prior art fabrication method;

FIGS. 17A to 17D show the process sequence of a fabrication method according to a fifth example of the invention;

FIGS. 18A to 18D show the process sequence of a fabrication method according to a sixth example of the invention.

DETAILED DESCRIPTION OF THE PREFERRED EMBODIMENTS

Figure 1A:
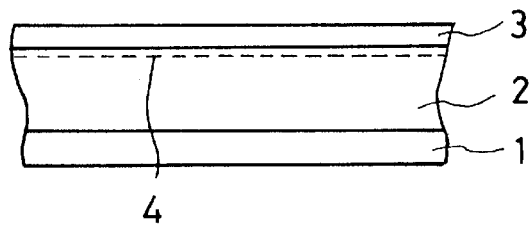
FIGS. 1A to 1E show the process sequence of a fabrication method according to a first example of the invention.
Figure 1B:
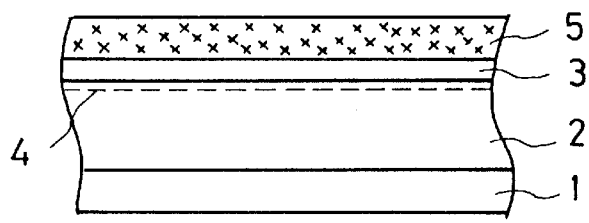
Figure 1C:
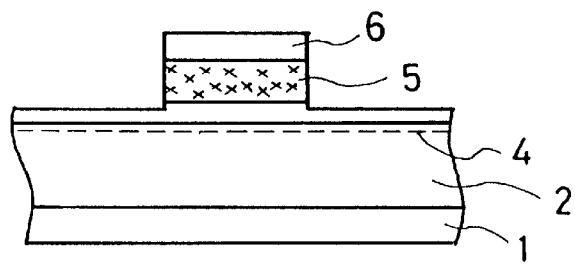
Figure 1D:
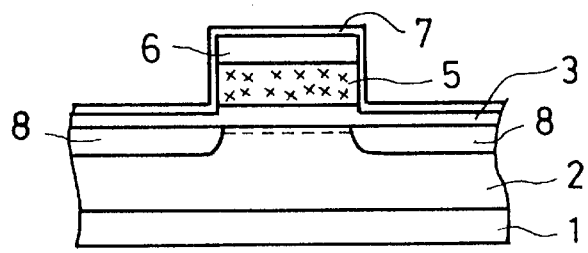
Figure 1E:
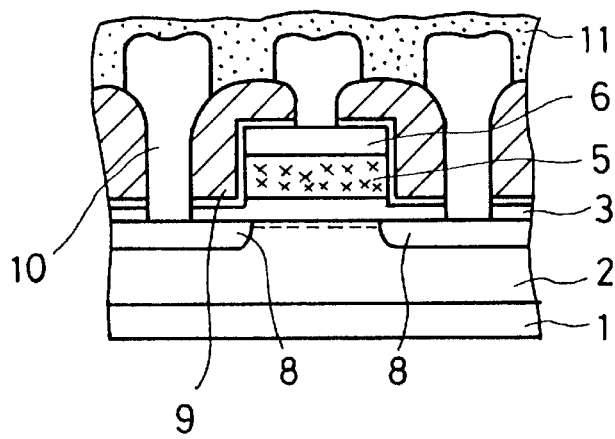

A first example of a semiconductor fabrication method according to the present invention is described in detail. Manufacturing steps for fabricating a PMOS transistor of the P+ polycide gate structure are described by referring to FIG. 1. In step A, ions of an N-type impurity (e.g., phosphorus) are implanted into the surface of a P-type silicon substrate 1. The substrate is then heat-treated at 1150° C. to diffuse and activate the implanted impurity phosphorus. As shown, an N well layer 2 is formed. Instead of forming the N well layer in the P-type silicon substrate, an N-type silicon substrate may be used. A gate oxide film 3 (e.g., 150 Å thick) is formed on the N well layer 2 by a heat treatment at 860° C. Then, a channel implantation is made at 4 to adjust the threshold voltage of the PMOS transistor. N-type impurities such as phosphorus or arsenic are introduced.

Then, in step B, polysilicon 5 is deposited on the gate oxide film by a CVD process. For the novel device, polysilicon 2000 Å thick is formed. P-type impurity ions are implanted to make the polysilicon P-type. For the novel device, a boronic compound $BF_2$ is used as an ionic species instead of boron alone and implanted. The implantation density is so set that ion-implanted/polysilicon film thickness=more than 2E19 atoms/$cm^3$. That is, where the polysilicon film thickness is 2000 Å, the concentration is more than 4E14 atoms/$cm^2$, more preferably 8E15 atoms/$cm^2$. Where the polysilicon film thickness is 3000 Å, the concentration is more than 6E14 atoms/$cm^2$, more preferably 1.2E16 atoms/$cm^2$. As the ion implantation concentration is increased, the implantation time is increased. Therefore, as the ion implantation concentration decreases, the processing can be completed in a shorter time. However, if the concentration is too low, the following problems occur. The channel in a MOS transistor is inverted by applying a certain voltage to the drain and applying a voltage exceeding the threshold voltage to the gate electrode. An electrical current is induced between the source and drain, and the device is set into operation. If the concentration is low, a depletion layer is created inside the polysilicon. The applied voltages are captured by the depletion layer and so excessive voltage is necessary. The result is that the absolute value of the threshold voltage increases. More specifically, the threshold voltage is simply given by $$VTH = V_{FB} + 2\Phi_F - Q_B/C_{OX}$$

where $V_{FB}$ is the flatband voltage, $\Phi_F$ is the Fermi potential, $Q_B$ is the charge on the depletion layer at the surface of the substrate, and $C_{OX}$ is the capacitance of the gate oxide film. Since the depletion layer in the polysilicon has a capacitance and is connected in series with the capacitance of the gate oxide film, $C_{OX}$ decreases apparently. It follows that VTH increases in the negative direction and increases in absolute value.

The channel conductance gm is given by $gm = (W/L) * \mu C_{ox} V_D$
where W is the width of the gate electrode of the transistor, L is the length of the gate electrode of the transistor, $\mu$ is the mobility, and VD is the drain voltage. $C_{OX}$ decreases, and the channel conductance is reduced.

If the threshold voltage decreases down to about 0.5 V, then the channel is weakly inverted provided that no gate voltage is applied. As a result, an electrical current is induced between source and drain (leakage current). To help one understand this, reference is made to FIG. 3. In the graph, the horizontal axis indicates the gate voltage $V_G$ in linear scale, while the vertical axis indicates the drain current $I_D$ in logarithmic scale. The indicated data are obtained by measurements performed under the condition that the drain voltage $V_D$=0.1 V. Every value is given in absolute value. It can be seen from this graph that where the gate voltage $V_G$=0 V, the drain current $I_D \ne 0$ A. That is, a current is induced even if the MOS transistor is not operated. The inverse of the slope of the characteristic curve, i.e., $V_G/\log(I_D)$, is referred to as the subthreshold factor S, which is an important value in determining the switching performance of the MOS transistor. This factor is in proportion to $C_D/C_{OX}$ (CD is the capacitance of the depletion layer at the surface of the substrate). That is, reducing $C_{OX}$ results in an increase in S and an increase in the leakage current. For example, the ion implantation acceleration energy is set to about 40 KeV. Since the molecular weight of $BF_2$ is larger than that of B alone, the range is smaller during ion implantation. Hence, $BF_2$ ions can be implanted into the surface of polysilicon. Conversely, B has a larger range and so if the same acceleration energy as used for $BF_2$ is applied to it, then boron will enter the silicon substrate. To prevent this, the acceleration energy must be reduced considerably. To activate and diffuse the implanted impurity ions, the laminate is heat-treated at a temperature of 700 to 900° C., e.g., 850° C., to make the polysilicon P-type. If the heat treatment is not sufficient, boron is not uniformly distributed in the polysilicon but distributed at a higher concentration at the surface. In consequence, depletion layers are easily produced. Conversely, if a high-temperature heat-treatment is performed, boron will diffuse across the gate oxide film into the silicon substrate. As a result, the threshold voltage varies, i.e., the absolute value decreases.

In the next step C, a tungsten silicide film 6 is deposited to a thickness of less than 2000 Å, e.g., 1000 Å, on the polysilicon 5 by a CVD method. Photoresist is patterned. The polysilicon and the silicide film are etched at the same timing, thus forming polycide gates.

Figure 4:
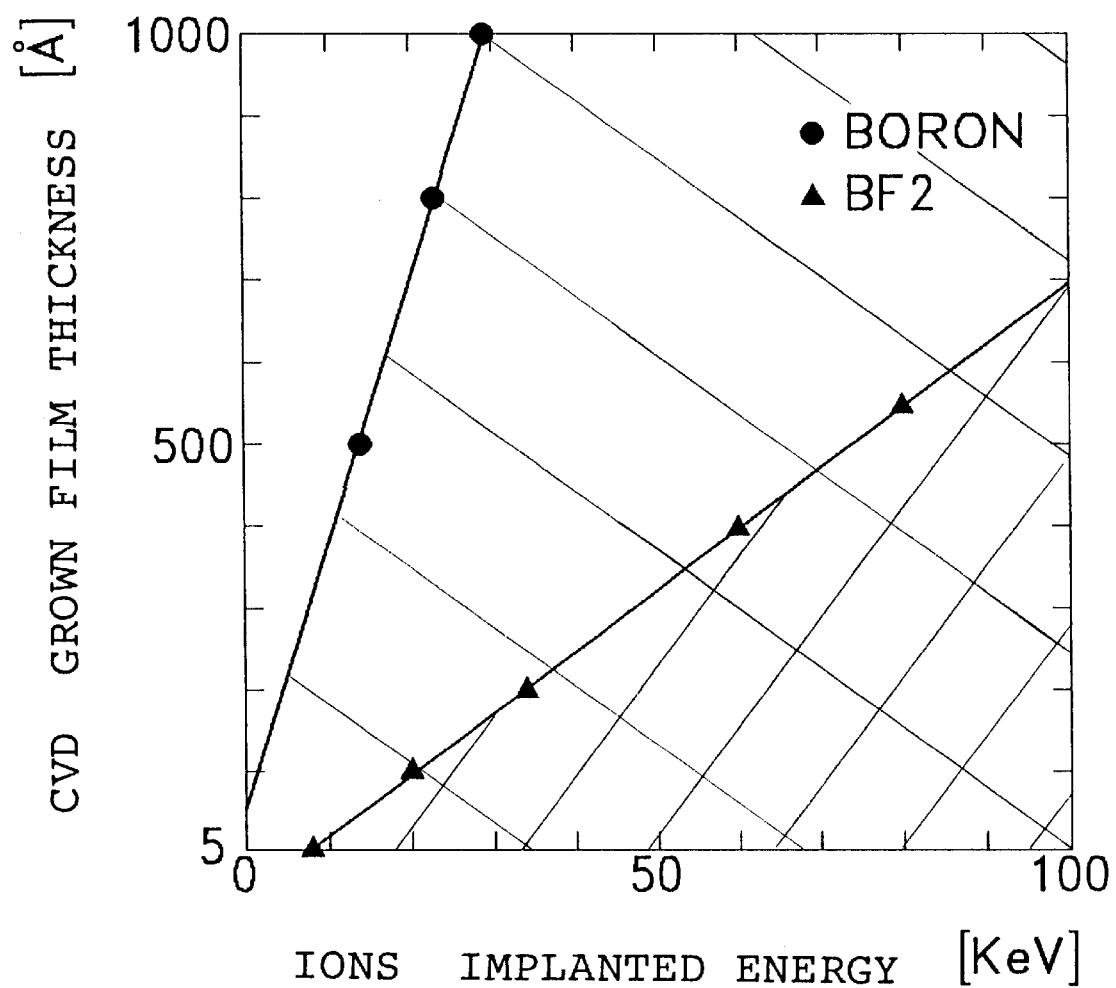
FIG. 4 shows maximum film thickness of CVD-grown films against ion implantation energy when source/drain regions are formed.

In the next step D, a CVD-grown dielectric film 7 having a thickness of 5 to 1000 Å is formed at a temperature lower than 850° C., e.g., 400° C., over the whole surface of the substrate. The relation of the CVD-grown film thickness to the energy with which ions are implanted to form the source/drain regions is shown in FIG. 4. Since the formation of the source/drain regions is done after the step of forming the CVD-grown film, the ions are implanted through this CVD-grown film. That is, FIG. 4 indicates the maximum film thickness of the CVD-grown film relative to the energy with which the ions are implanted to form the source/drain regions. Where implanted impurity ions are boron ions, the inside of a region indicated by the rightwardly downwardly directed oblique line is desired, if the implanted ion impurities are boron ions. Where the impurities are $BF_2$, the inside of a region indicated by the leftwardly downwardly directed oblique line is desirable. For the novel device, a CVD-grown dielectric film 400 or 40 Å thick is formed. In the prior art techniques, a film has been formed by thermal oxidation and so boron inside polysilicon diffuses into tungsten silicide, thus lowering the concentration. This, in turn, results in an increase in the threshold voltage. Where the surface of the polysilicon is heavily doped with,boron, the amount of boron diffusing into the tungsten silicide is greater than the amount of boron uniformly distributed in the polysilicon. Furthermore, as the silicide film is increased in thickness, more boron is diffused. After forming the dielectric film 7, P-type impurity ions are implanted at a high concentration, thus forming source/drain regions. For the novel device, boron ions are implanted into the CVD-grown film having a thickness of 400 Å at an energy of 30 KeV. $BF_2$ ions are implanted into the CVD-grown film having a thickness of 40 Å at an energy of 80 KeV.

Finally, in step E, an interlayer film 9 of BPSG is formed over the whole surface. This interlayer film 9 is formed, for example, by CVD or other method. Subsequently, the laminate is heat-treated to planarize the surface. In the prior art heat treatment, planarization is carried out at 920° C. for about 75 minutes. Therefore, as mentioned previously, boron inside the polysilicon diffuses into the tungsten silicide to thereby lower the concentration, which in turn raises the threshold voltage. In the present invention, the laminate is heat-treated at a temperature of 800–1050° C. for a short time by RTA techniques. For instance, the laminate is heat-treated at about 1025° C. for about 45 seconds. Furthermore, to facilitate planarization, the phosphorus content of the BPSG interlayer film is changed from 5 wt. % to 6 wt. %. This suppresses diffusion of boron into the tungsten silicide. This heat treatment also activates and diffuses the implanted impurity ions in the source/drain regions. Subsequently, the interlayer film 9 is selectively etched to form contact holes communicating with the source/drain regions and with gate electrodes. Thereafter, contact reflow processing is performed. In the past, this processing has consistey of a heat treatment conducted at 880° C. for about 30 minutes. In the invention, the processing consists of a heat treatment (RTA) performed at 850° C. for about 30 seconds to suppress diffusion of boron into the tungsten silicide. Subsequently, a metallic material film is formed over the whole surface by vacuum evaporation, sputtering, or other method. Then, a photolithography or etching step is carried out to form a metal interconnect pattern 10. Finally, the whole substrate 1 is coated with a surface-protecting film 11.

Figure 5A:
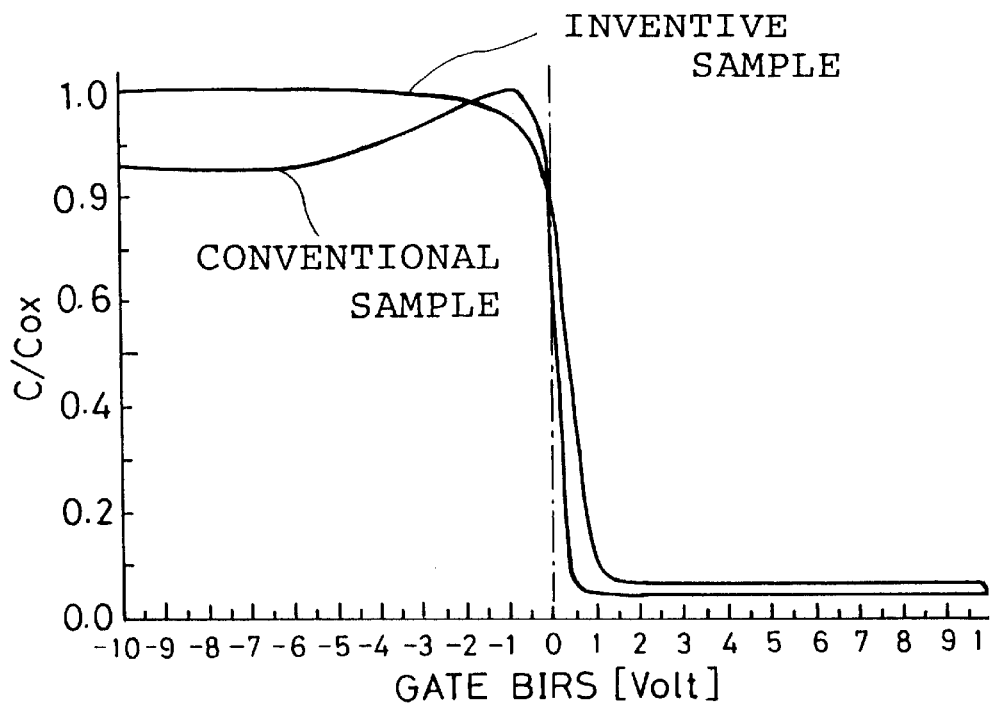
FIGS. 5A to 5C show the capacitance characteristics of gate electrodes.
Figure 5B:
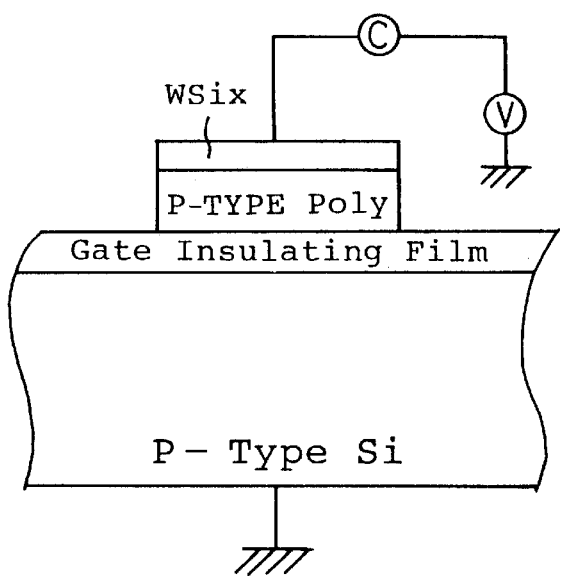
Figure 5C:
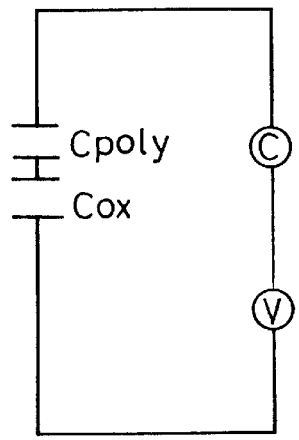

FIGS. 5A to 5C show views illustrating the capacitance characteristics of gate electrodes. In the graph of FIG. 5A, voltages applied to the gate electrode are plotted on the horizontal axis. Plotted on the vertical axis are measurement values obtained by dividing the total capacitance C of the gate electrodes by the capacitance $C_{OX}$ of the gate oxide film. FIG. 5B is a cross-sectional view of the substrate when a measurement is made. FIG. 5B also shows the manner in which leads are connected. FIG. 5C shows an equivalent circuit of FIG. 5B, and in which $C_{POLY}$ is the capacitance of a gate electrode. In the graph of FIG. 5A, the region in which the voltage applied to the gate is negative is the capacitance of the gate electrode and gate oxide film. The positive region is the capacitance of the depletion layer in the substrate. With respect to the novel device, in the region where the voltage applied to the gate is negative, $C/C_{OX}$ is 1 for almost all the region. With respect to the prior art device, the ratio is 0.86, for the following reason. No depletion layer exists inside the gate electrode of the novel device and so the gate electrode capacitance $C_{POLY}$ is absent. It follows that $C/C_{OX}=C_{OX}/C_{OX}=1$. On the other hand, a depletion layer exists in the gate electrode of the prior art device. Because of the gate electrode capacitance $C_{POLY}$, we have $C/C_{OX}=C_{POLY}/(C_{OX}+C_{POLY})$. Therefore, the capacitance is less than unity. That is, the relation $C/C_{OX}<1$ means that the concentration in the gate electrode is low. PMOS transistors of both structures were manufactured. The PMOS transistor of the novel structure has a threshold value |VTHP|=0.05 V. The PMOS transistor of the prior art structure has a greater value of 0.71 V.

Figure 6:
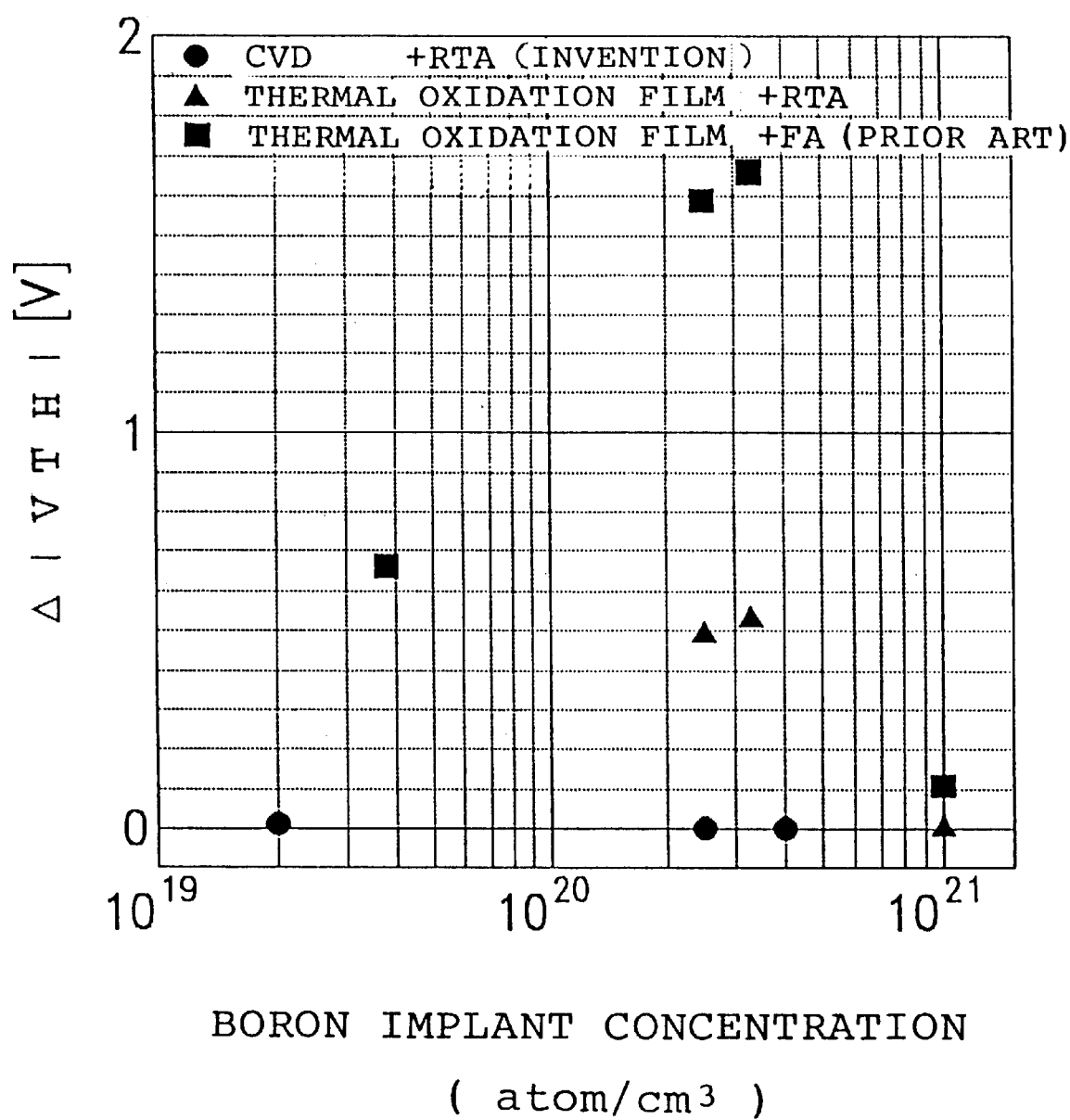
FIG. 6 shows amounts of variations in threshold voltage against concentration of boron implanted into polysilicon.

FIG. 6 shows threshold voltage variations against boron implant concentration in polysilicon when each step is carried out. The boron implant concentration is plotted on the horizontal axis. Variations in the threshold voltage are plotted on the vertical axis. In the novel device, |VTH| remains unchanged where the implant concentration is more than 2E19 atoms/cm$^3$. For the prior art device, |VTH| has changed although the implant concentration is only 1E21 atoms/cm$^3$. A considerable time was required to implant up to the concentration of 1E21 atoms/cm$^3$.

A second example of a-semiconductor fabrication method according to the invention is described in detail.

Manufacturing steps for fabricating a LDD structure PMOS transistor having a P$^+$ polycide gate are described by referring to FIGS. 7A to 7D. In step A, N-type impurity ions such as phosphorus ions are implanted into the surface of a P-type silicon substrate 1. Then, the substrate is heat-treated at 1150° C. to diffuse and activate the implanted impurity phosphorus ions, thus forming an N well layer 2. A gate oxide film 3 having a thickness of 150 Å, for example, is formed on the layer 2 by a heat treatment at 860° C. Then, a channel implant is performed at 4 to adjust the threshold voltage of the PMOS transistor, and N-type impurities such as phosphorus or arsenic are implanted. Then, polysilicon 5 is deposited on the gate oxide film 3 by a CVD process. For the inventive device, polysilicon is deposited to 2000 Å. To make this polysilicon P-type, P-type impurity ions are implanted. For the inventive device, a boronic compound $BF_2$ is used as an ionic species instead of boron alone and implanted. The implantation density is such that ion implanted/polysilicon film thickness=more than 2E19 atoms/cm$^3$. Then, in order to activate and diffuse the implanted impurity ions, the laminate is heat-treated at a temperature of 700–900° C., e.g., 850° C., to make the polysilicon P-type. Subsequently, a tungsten silicide film 6 is deposited to a thickness of less than 2000 Å, e.g., 1000 Å, on the polysilicon 5 by a CVD method. Photoresist is patterned. The polysilicon and silicide film are etched at the same timing to form polycide gate electrodes. Then, a CVD-grown dielectric film 7 having a thickness of 5 to 1000 Å is formed at a temperature lower than 850° C., e.g., 400° C., over the whole surface of the substrate. For the inventive device, a CVD-grown dielectric film is formed to 400 Å. In the prior art techniques, a film has been formed by thermal oxidation and, therefore, boron in polysilicon has diffused into tungsten silicide, thus lowering the concentration. This has, in turn, increased the threshold voltage. Where the surface of polysilicon is heavily doped with boron, a greater amount of boron is diffused into the tungsten silicide than the amount of boron uniformly distributed in the polysilicon. Thereafter, lightly doped drain (LDD) regions 12 are formed. Also in this case, ions are implanted through the CVD-grown dielectric film 7 into the semiconductor substrate-in the same way as the foregoing. Therefore, the CVD-grown film thickness relative to the energy of the implanted ion can assume a maximum value (equivalent to FIG. 4). For the inventive device, impurity ions $BF_2$ are implanted at an acceleration energy of 70 KeV at 3E13 atoms/cm$^2$. This CVD-grown dielectric film 7 is used as a shock-absorbing material against semiconductor substrate damage caused by LDD ion implantation.

In step B, a CVD-grown dielectric film 2500 Å thick, for example is deposited over the whole surface of the substrate and etched to form side spacers 13.

In step C, a heat treatment is made at a temperature of 800 to 1050° C. for a short time in an oxygen ambient. For example, the laminate is heat-treated at about 960° C. for about 45 seconds to form an oxide film 14 and to heal damage caused by the etching in the previous step. In the prior art techniques, a film has been formed by thermal oxidation effected at 950° C. for 45 minutes. Therefore, boron in polysilicon has diffused into tungsten silicide, thus lowering the concentration. This has increased the threshold voltage. Then, P-type impurity ions are implanted through the oxide film 14 to form source/drain regions. For the inventive device, ions of impurity $BF_2$ are implanted at 80 KeV at 5E15 atoms/cm$^2$.

In the final step D, an interlayer film 9 of BPSG is formed over the whole surface. This interlayer film 9 is formed, for example, by CVD or other method, and then the film is planarized by thermal processing. In the prior art thermal processing, planarization has been done at 920° C. for about 75 minutes. Therefore, as mentioned above, boron in polysilicon has been diffused into the tungsten polycide, resulting in a decrease in the concentration. As a result, the threshold voltage has been increased. In the present invention, a heat treatment is made at a temperature of 800 to 1050° C. for a short time (RTA). For example, the heat treatment is made at about 980° C. for about 45 seconds. Furthermore, to facilitate planarization, the phosphorus content of the BPSG interlayer film is changed from 5 wt. % to 6 wt. %. This suppresses diffusion of boron into the tungsten silicide. This heat treatment also activates and diffuses the implanted impurity ions in the source/drain regions. Subsequently, the interlayer film 9 is selectively etched to form contact holes communicating with the source/drain regions and with the gate electrodes. Thereafter, contact reflow processing is performed. In the past, this processing has consisted of a heat treatment carried out at 880° C. for about 30 minutes. In the invention, the processing consists of a heat treatment (RTA) made at 850° C. for about 30 seconds to suppress diffusion of boron into the tungsten silicide. Subsequently, a metallic material film is formed over the whole surface by vacuum evaporation, sputtering, or other method. Then, a photolithography or etching step is performed to form a metal interconnect pattern 10. Finally, the whole substrate 1 is coated with a surface-protecting film 11.

A third example of a semiconductor fabrication method according to the present invention is described in detail. First, the method is described up to the step in which the gate oxide film of a CMOS transistor of the bipolar polycide gate structure is formed by referring to FIGS. 8A to 8D. In step A, an N well layer 2 is formed on the surface of a P-type silicon substrate 1. An oxide film 14 patterned in a desired form is formed as a mask on the surface of the substrate. Then, N-type impurity ions (e.g., phosphorus ions) are implanted at a dose of 2E12 atoms/cm$^2$. Thereafter, a heat treatment is made at 1150° C. for 6 hours to diffuse and activate the implanted impurity phosphorus ions. Thus, the N well layer 2 is formed as shown. It follows that a P-channel MOS transistor is formed on this N well layer 2 and that an N-channel MOS transistor is formed at an adjacent location.

In step B, a field implant is made. For this purpose, a patterned silicon nitride film 15 is formed so as to cover an active region on which a transistor device is to be fabricated. Especially over the N well 2, photoresist 16 is formed so as to overlap the silicon nitride film 15. Under this condition, impurity boron ions are implanted at an acceleration energy of 30 KeV at a dose of 2E13 atoms/cm$^2$, thus carrying out a field implant. As shown, a field implanted region is formed around the device region.

Subsequently, in step C, so-called LOCOS processing is performed to form a field oxide film 17 around the device region. Then, sacrificial oxidation and processing for removing it are performed. Foreign matter left on the surface of the substrate 1 is removed, and it is cleaned.

Finally, in step D, the surface of the substrate 1 is thermally oxidized to form a gate oxide film 3 so as to cover the device region. This thermal oxidation processing is carried out at a temperature of 860° C. in a $H_2O$ ambient. The oxide film is grown to about 150 Å.

Then, the following steps are described by referring to FIGS. 8E to 8H. First, in step E, a channel implant is made to adjust the threshold voltage of the P-channel MOS transistor. A photoresist pattern 16 is formed on the surface excluding the surface of the N well layer 2 over which the P-channel MOS transistor is to be formed. Then, an N-type impurity such as phosphorus or arsenic is introduced. The region adjacent to the region over which the N-channel MOS transistor is to be formed is masked with the photoresist 16 and remains undoped.

Figure 10:
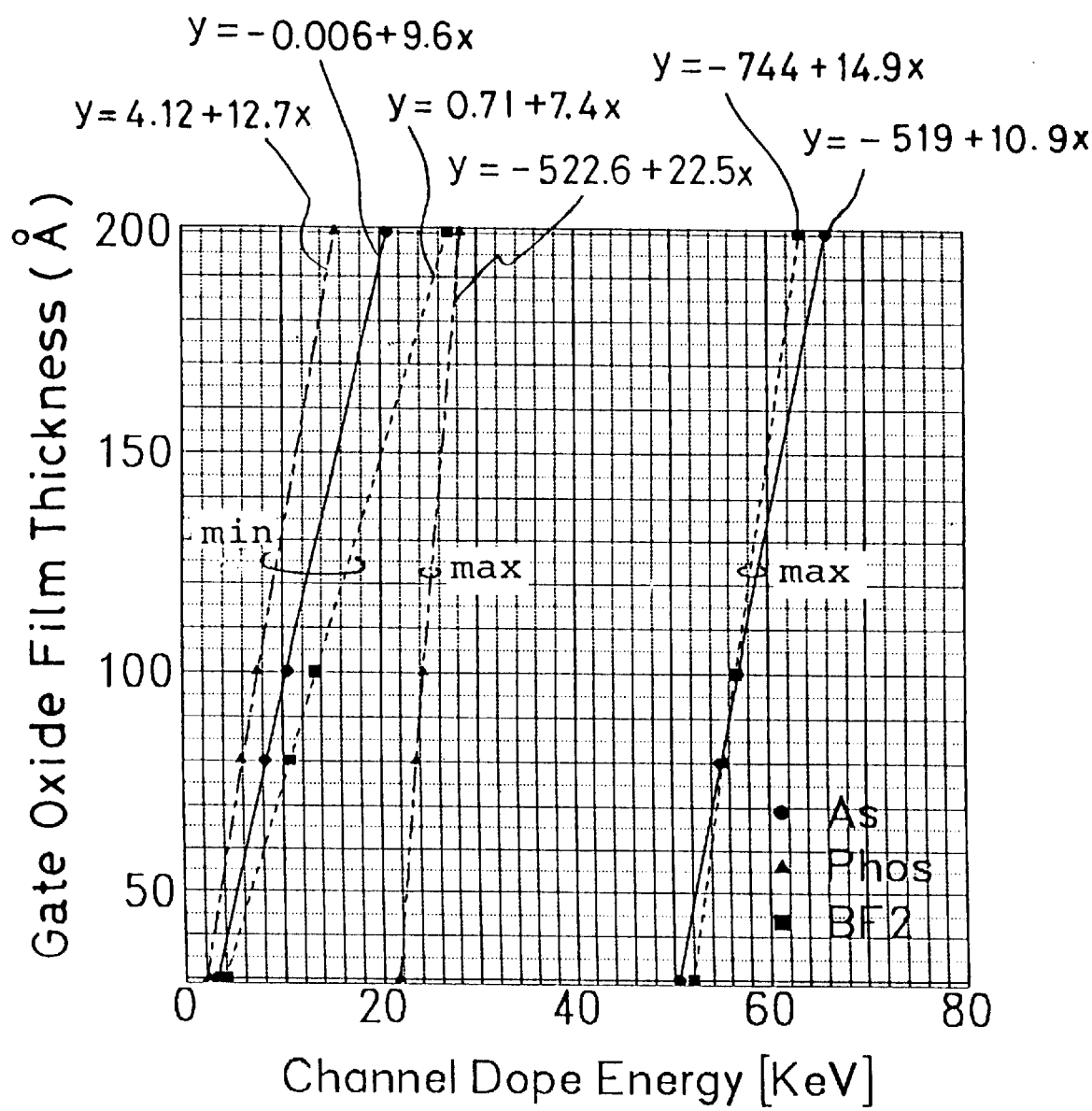
FIG. 10 shows the range of energies of channel implant against gate oxide film thickness.

The implant acceleration energy shows a maximum value and a minimum value relative to the intervening oxide film thickness for each impurity when ions are implanted. The relations are shown in FIG. 10. The gate oxide film thickness is plotted on the vertical axis of FIG. 10. The channel implant energy is plotted on the horizontal axis. The range of possible acceleration energies is located to the right of the MIN lines for various impurities and to the left of the MAX lines. For example, where the oxide film thickness is 150 Å, arsenic is from 16 KeV to 61 KeV. Phosphorus is from 12 KeV to 26 KeV. Where the thickness is 120 Å, arsenic is from 13 KeV to 58 KeV. Phosphorus is from 10 KeV to 25 KeV. Where the thickness is 100 Å, arsenic is from 11 KeV to 56 KeV. Phosphorus is from 8 KeV to 24 KeV.

Figure 11:
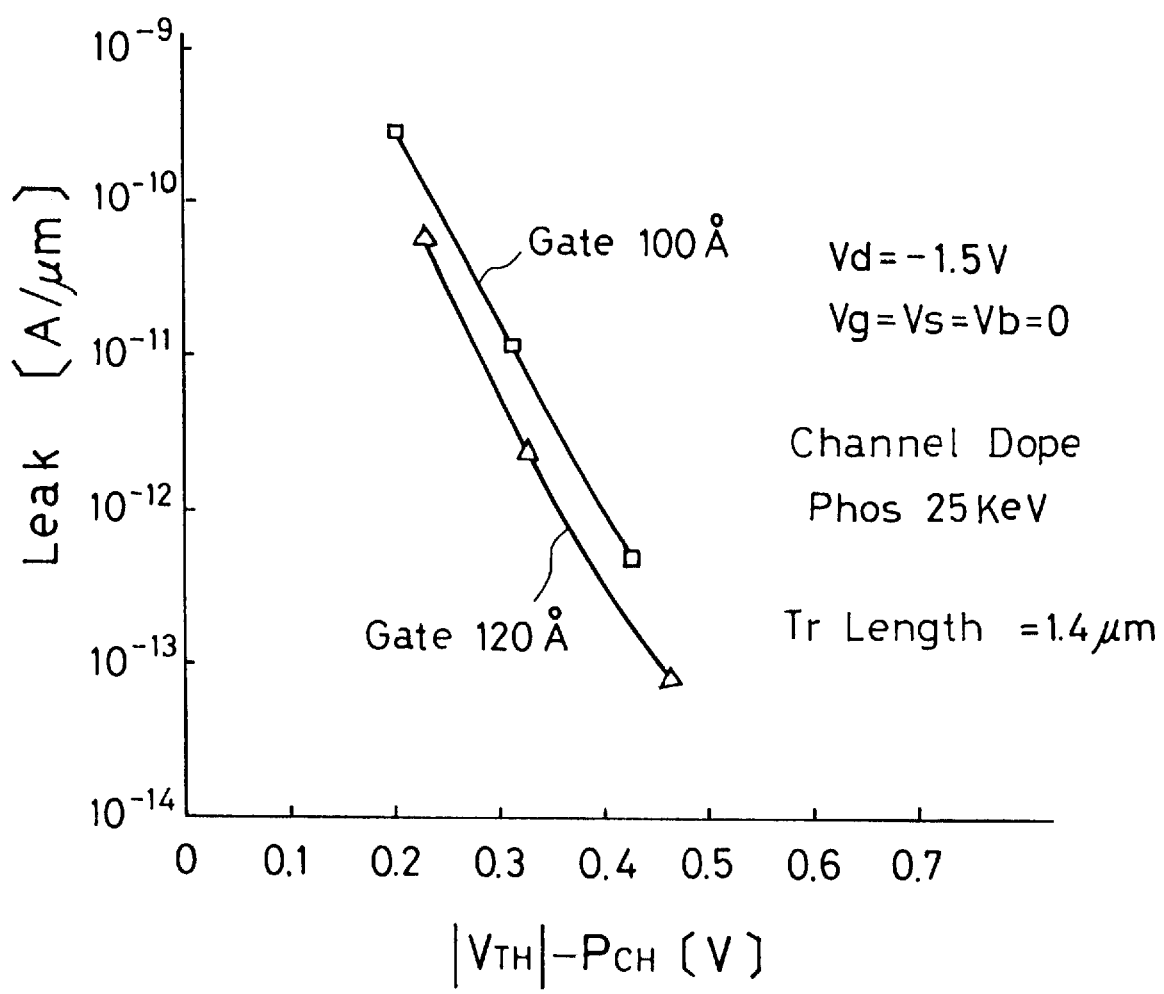
FIG. 11 shows leakage currents against threshold voltages of P-channel MOS transistors.

FIG. 11 shows a leakage current per unit gate electrode width against the threshold voltage of the P-channel MOS transistor. The leakage current is plotted on the vertical axis of FIG. 11, while the threshold voltage is plotted on the horizontal axis. For a channel implant, or channel doping, N-type phosphorus ions are implanted at an acceleration energy of 25 KeV. The leakage current of the P-channel MOS transistor having a gate electrode length of 1.4 μm was measured where the drain voltage (Vd) was −1.5 V. It can be seen that the leakage current of the device having a gate oxide film thickness of 100 Å is about four times as large as the leakage current of the device having a gate oxide film thickness of 120 Å, because ions were implanted into the gate oxide film 100 Å thick at an acceleration energy of 25 KeV.

Figure 12:
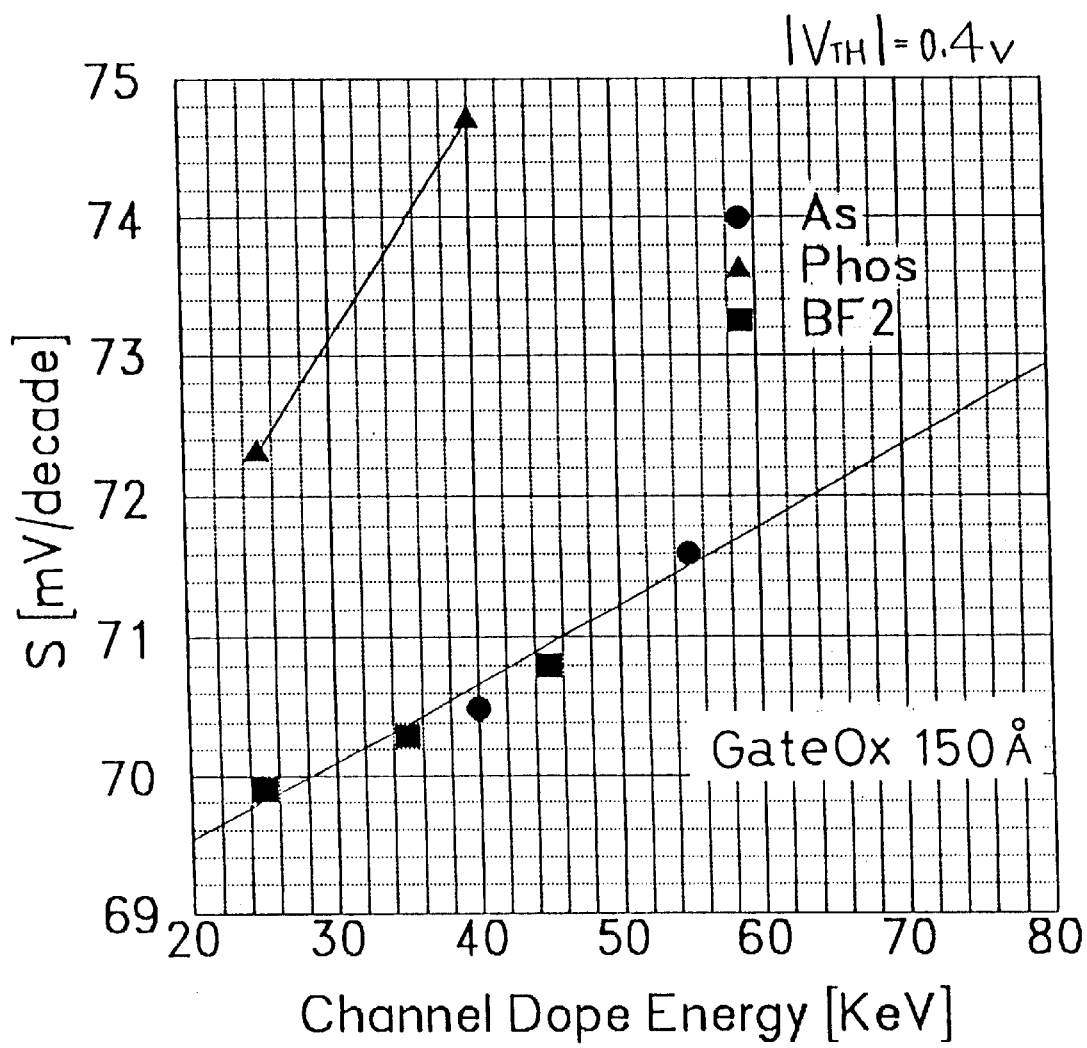
FIG. 12 shows subthreshold characteristics against channel implant energy.

FIG. 12 shows the subthreshold factor S against channel implant energy. The subthreshold factor S is plotted on the vertical axis of FIG. 12. The channel implant energy is plotted on the horizontal axis. Where the gate oxide film thickness was 150 Å and the absolute value of the threshold value was 0.4 V, measurements were made. It can be seen that as the energy decreases, S decreases. Where arsenic is accelerated at an energy of 60 KeV, S is less than 71.8 mV/decade. On the other hand, where phosphorus is accelerated at an energy of 40 KeV, S is 74.7 mV/decade. This is because arsenic can provide smaller S than phosphorus for the same energy. As mentioned previously, as S is reduced, the transistor operates at a higher speed. Furthermore, the leakage current can be suppressed where the threshold voltage is low.

Figure 13:
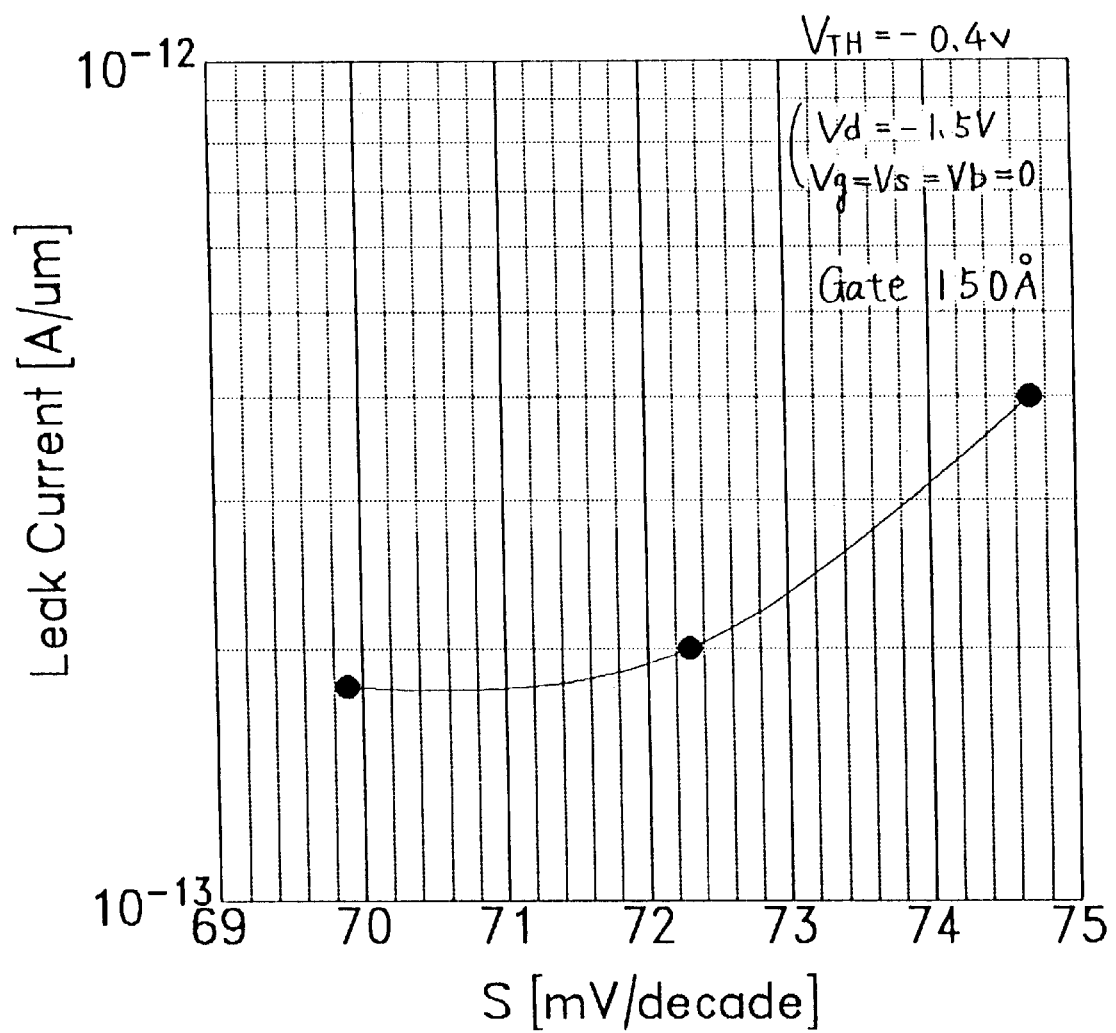
FIG. 13 shows leakage currents against the subthreshold factors of P-channel MOS transistors.

FIG. 13 shows the leakage current per unit gate electrode width against the subthreshold factor of a P-channel MOS transistor. The leakage current is plotted on the vertical axis of FIG. 13. The subthreshold factor S is plotted on the horizontal axis. The leakage current was measured under the conditions that the gate oxide film thickness was 150 Å, the drain voltage (Vd) was −1.5 V, and the threshold voltage was −0.4 V. It can be seen that where S exceeds 74 mV/decade, the leakage current increases by a factor of more than about 2.

In the next step F, a channel implant is made to adjust the threshold voltagae of the N-channel MOS transistor. After removing the photoresist 16 formed in the previous step, the surface is masked with photoresist 16 except for the region over which the N-channel MOS transistor is to be formed. A P-type impurity such as $BF_2$ is implanted. The acceleration energy shows a maximum value and a minimum value relative to the intervening oxide film thickness for each impurity when ions are implanted (FIG. 10), in the same manner in the case of the P-channel MOS transistor. For example, where the oxide film thickness is 150 Å, the energy is from 20 KeV to 60 KeV. Where the thickness is 120 Å, the energy is from 16 KeV to 58 KeV. Where the thickness is 100 Å, the energy is from 14 KeV to 56 KeV.

Figure 14:
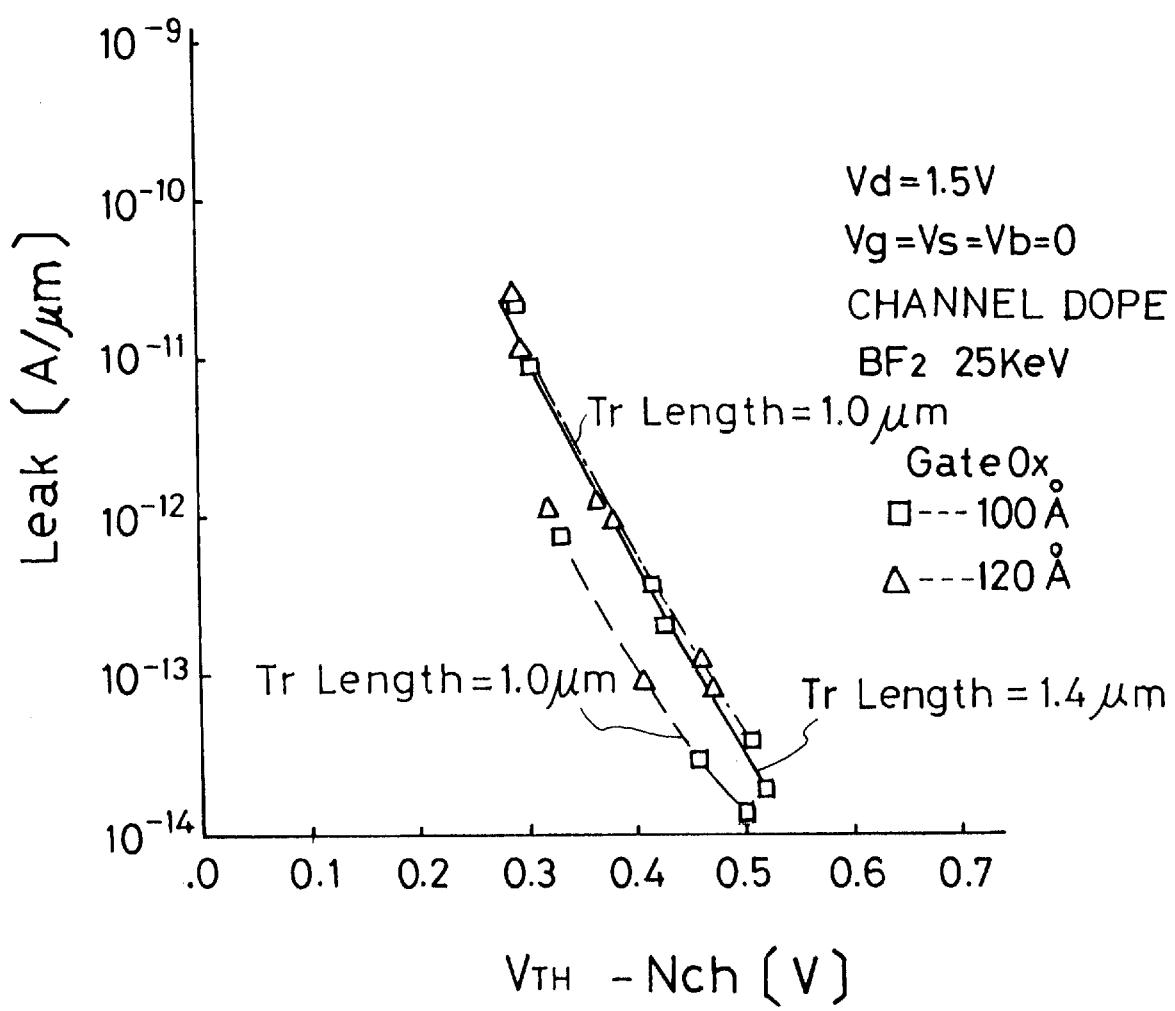
FIG. 14 shows leakage currents against the threshold factors of N-channel MOS transistors.

FIG. 14 shows the leakage current per unit gate electrode width against the threshold voltage of an N-channel MOS transistor. The leakage current is plotted on the vertical axis of FIG. 14. The threshold voltage is plotted on the horizontal axis. For the channel implant, $BF_2$ ions are implanted as P-type impurity ions at an acceleration energy of 25 KeV. Leakage currents of P-channel MOS transistors having gate electrode lengths of 1.0, 1.4, and 10 μm, respectively, were measured when the drain voltage (Vd) was 1.5 V. For each gate electrode length, substantially the same leakage current is obtained from the devices having the gate oxide film thicknesses of 100 and 120 Å, respectively.

In the next step G, the photoresist 16 formed in the previous step is removed. Then, polysilicon 5 is deposited on the gate oxide film by a CVD method. For the novel device, polysilicon is deposited to 2000 Å. In order to form a gate electrode for an N-channel MOS transistor, the surface is first masked with the photoresist 16 except for the region over which the N-channel MOS transistor is to be fabricated. Subsequently, N-type impurity ions are implanted to make the polysilicon N-type. For the novel device, phosphorus or arsenic is used as an N-type impurity ion species implanted. The implantation concentration is so set that ion implanted/polysilicon film thickness=more than 2E19 atoms/$cm^3$. That is, where the polysilicon film thickness is 2000 Å, ions are implanted at more than 4E14 atoms/$cm^2$, more preferably 5E15 atoms/$cm^2$. Where the polysilicon film thickness is 3000 Å, ions are implanted at more than 6E14 atoms/$cm^2$, more preferably 8E15 atoms/$cm^2$. As the ion implant concentration increases, the implantation time is increased. Where the polysilicon film thickness is 2000 Å, phosphorus ions are implanted at an implantation energy of about 40 KeV. Arsenic ions are implanted at an implantation energy of about 90 KeV. Where the thickness is 3000 Å, phosphorus ions are implanted at an implantation energy of about 60 KeV. Arsenic ions are implanted at an implantation energy of about 110 KeV.

In the next step H, the photoresist 16 formed in the previous step is removed. Then, in order to form a gate electrode for a P-channel MOS transistor, the region previously doped with the N-type impurity ions are masked with photoresist 16. Subsequently, P-type impurity ions are implanted to make this polysilicon P-type. For the novel device, a boronic compound $BF_2$ is used as an ionic species instead of boron alone and implanted. The implantation concentration is such that ion implanted/polysilicon film thickness=more than 2E19 atoms/$cm^3$. The ion implantation acceleration energy is set to about 40 KeV, for example. Since the molecular weight of $BF_2$ is larger than that of B alone, the range is smaller during ion implantation. Hence, $BF_2$ ions can be implanted into the surface of polysilicon. Conversely, B has a larger range and therefore, if the same acceleration energy as used for BF is imparted to it, then boron will enter the silicon substrate. To prevent this, the acceleration energy must be reduced considerably. To activate and diffuse the implanted impurity ions, the laminate is then heat-treated at a temperature of 700 to 900° C., e.g., 850° C., to make the polysilicon N-type and P-type.

The subsequent steps are described by referring to FIGS. 8I to 8L. In step I, a tungsten silicide film 6 is deposited on the polysilicon 5 by a CVD method to less than 2000 Å, e.g., 1000 Å. Photoresist is patterned, and the polysilicon and silicide film are etched at the same timing, thus forming a P-type polycide gate electrode 18 and an N-type polycide gate electrode 19. As the silicide film thickness increases, more boron in the polysilicon diffuses into the silicide.

In the next step J. a CVD-grown dielectric film 7 is formed at a temperature lower than 850° C., e.g., 400° C., to 5–1000 Å, over the whole surface of the substrate. As described above, the CVD-grown dielectric film thickness depends on the energy of ions implanted during a later step for forming source/drain regions. For the novel device, the CVD-grown dielectric film is formed to 400 Å or 40 Å. In the prior art techniques, a film has been formed by thermal oxidation and so boron in polysilicon has diffused into tungsten silicide, thus lowering the concentration. This has increased the threshold voltage. Where the surface of the polysilicon is heavily doped with boron, a greater amount of boron diffuses into the tungsten silicide than the amount of boron uniformly distributed in the polysilicon.

In the next step K, source/drain regions of an N-channel MOS transistor are formed. At this time, the top surface of the N well layer 2 over which a P-channel MOS transistor is to be formed is masked with photoresist 16. Under this condition, N-type impurity phosphorus ions are implanted by self-alignment using the gate electrode 19 as a mask. The ions are implanted under the following conditions. Where the CVD-grown film thickness is 400 Å, phosphorus ions are implanted at an energy of 70 KeV at a dose of 5E15 atoms/cm$^2$. Where the thickness is 40 Å, the ions are implanted at an energy of 40 KeV at a dose of 3.5E15 atoms/cm$^2$. Phosphorus is used as the N-type impurity unlike the prior art techniques. Therefore, source/drain regions of a desired electrical conductivity can be obtained without performing a heat treatment later. In the past, arsenic having a small diffusivity has been employed as an N-type impurity and so high-temperature thermal diffusion processing at 950° C. has been required to be conducted for about 30 minutes. Hence, boron in the polysilicon has diffused into the tungsten silicide, thus lowering the concentration. This has increased the threshold voltage.

Finally, in step L, the remaining source/drain regions of the P-channel MOS transistor are formed. At this time, the previously formed N-channel MOS transistor portion is masked with photoresist 16. Under this condition, P-type impurity ions are implanted at a high concentration by self-alignment using the gate electrode 18 as a mask. For the novel device, where the CVD-grown film thickness is 400 Å, boron is implanted at an energy of 30 KeV at 5E15 atoms/cm$^2$. Alternatively, BF$_2$ is implanted at an energy of 80 KeV at a dose of 6E15 atoms/cm$^2$ or 3.5E15 atoms/cm$^2$. Where the thickness is 40 Å, BF$_2$ is implanted at an energy of 80 KeV at a dose of 5E15 atoms/cm$^2$ or 3.5E15 atoms/cm$^2$.

Figure 9:
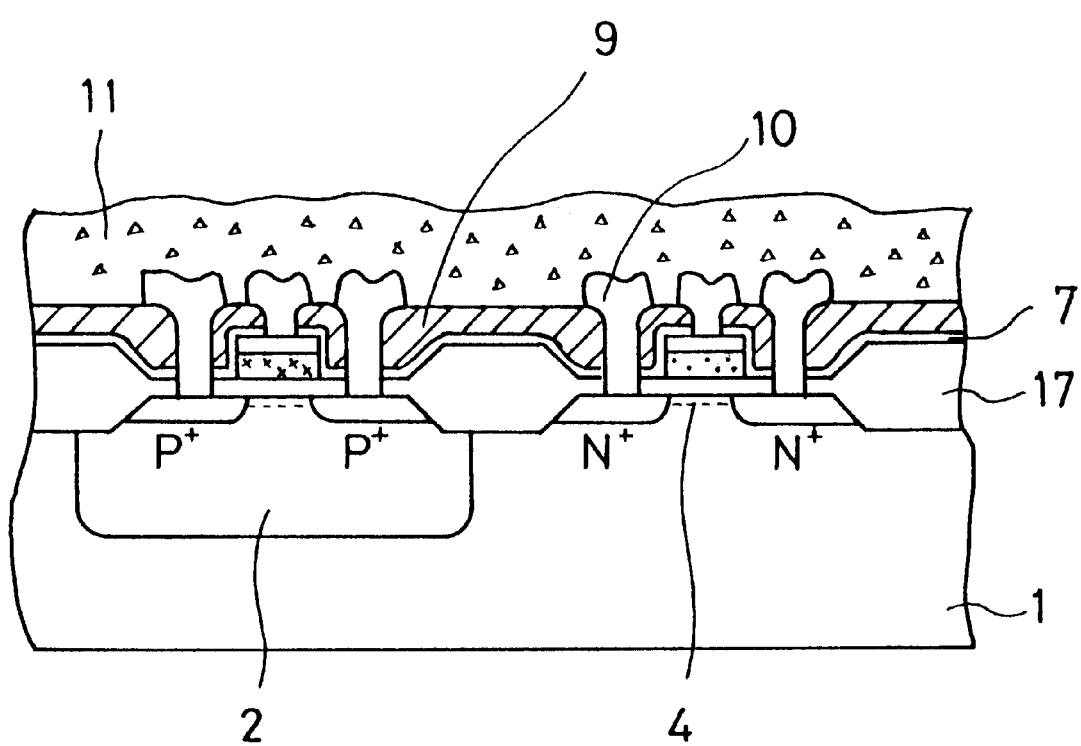
FIG. 9 shows a manufacturing step, illustrating a finished product according to the third example of the invention.

Then, metallization steps and other steps are described by referring to FIG. 9, which shows a finished CMOS transistor of the bipolar polycide gate structure. As shown, the source/drain regions of a P-channel MOS transistor are formed, and then photoresist 16 is removed. An interlayer film 9 of BPSG is formed over the whole surface. This interlayer film 9 is formed by CVD or other method. Subsequently, the surface is planarized by a heat treatment. In the prior art heat treatment, a planarization step has been carried out at 920° C. for about 75 minutes. Therefore, as mentioned previously, boron in polysilicon has diffused into tungsten silicide, thus lowering the concentration. This has resulted in an increase in the threshold voltage. In the present invention, a heat treatment is made (RTA) at a temperature of 800–1050° C. for a short time. For example, the heat treatment is made at about 1000° C. for about 45 seconds. Furthermore, to facilitate planarization, the phosphorus content of the BPSG interlayer film is changed from 5 wt. % to 6 wt. %. This suppresses diffusion of boron into the tungsten silicide. This heat treatment also activates and diffuses the implanted impurity ions in the source/drain regions. Subsequently, the interlayer film 9 is selectively etched to form contact holes communicating with the source/drain regions and with gate electrodes. Thereafter, contact reflow processing is performed. In the past, this processing has consisted of a heat treatment effected at 880° C. for about 30 minutes. In the invention, the processing consists of a heat treatment (RTA) made at 850° C. for about 30 seconds to suppress diffusion of boron into the tungsten silicide. Subsequently, a metallic material film is formed over the whole surface by vacuum evaporation, sputtering, or other method. Then, a photolithography or etching step is carried out to form a metal interconnect pattern 10. Finally, the whole substrate 1 is coated with a surface-protecting film 11.

Figure 15:
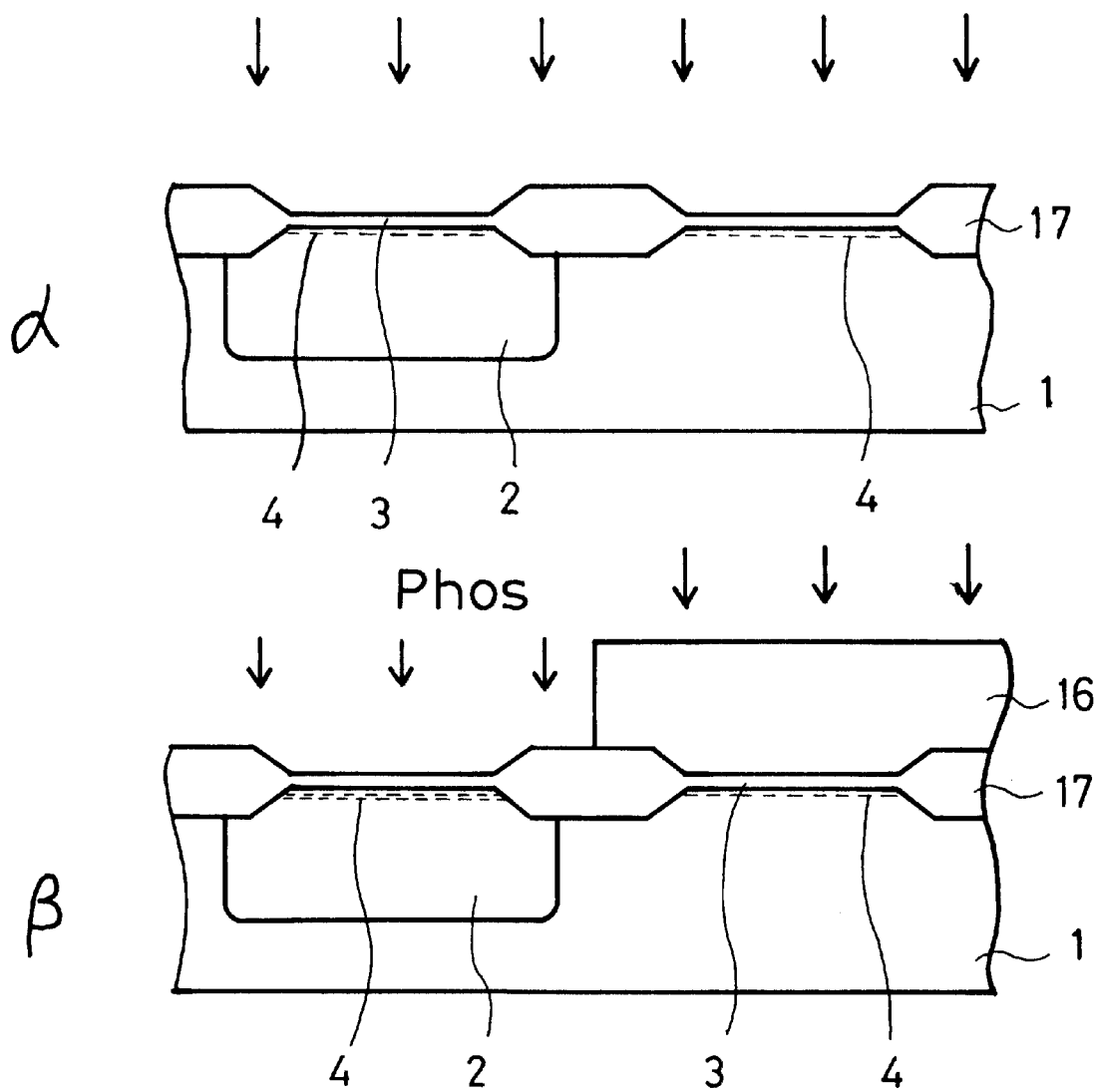
FIG. 15 shows the process sequence of a fourth example of the invention.

A fourth example of a semiconductor fabrication method according to the invention is described in detail. Steps for forming a channel implanted layer for CMOS transistors of the bipolar polycide gate structure are described by referring to FIG. 15. The steps are similar to the steps shown in FIGS. 8A to 8D up to step A. In the step A, the channel of an N-channel MOS transistor is doped. P-type impurity BF$_2$ is implanted into the whole surface of the semiconductor substrate.

Figure 8A:
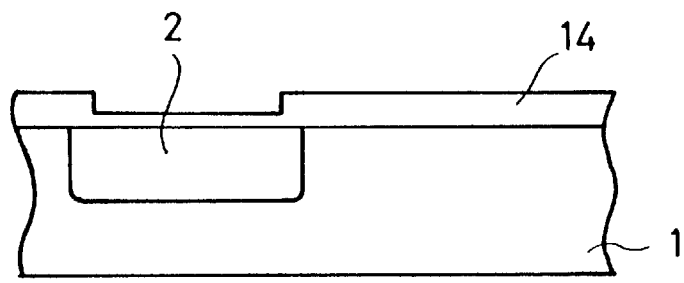
FIGS. 8A to 8L show the process sequence of a fabrication method according to a third example of the invention.
Figure 8B:
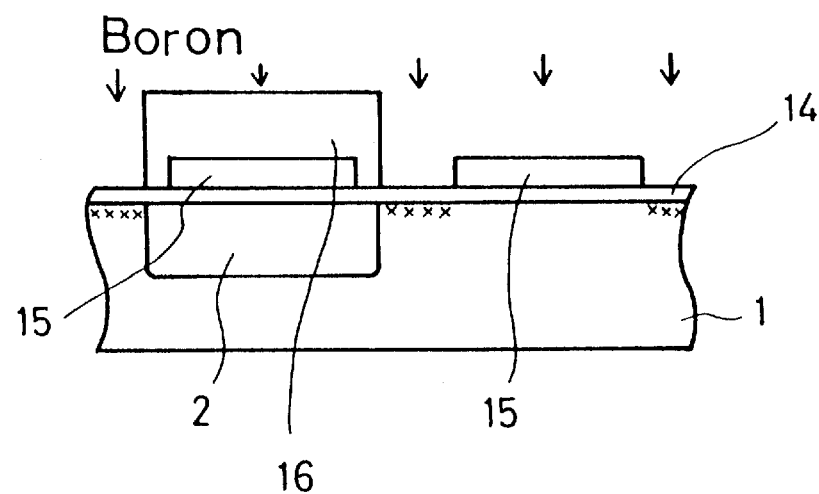
Figure 8C:
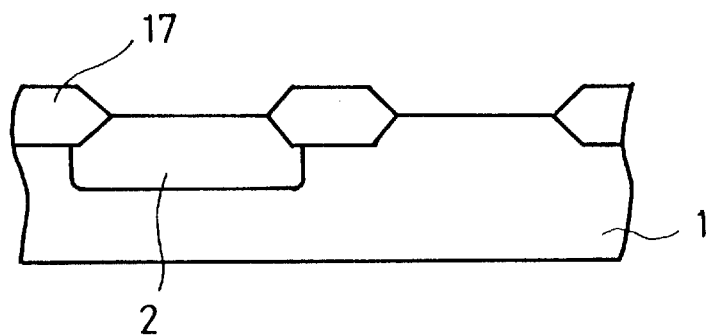
Figure 8D:
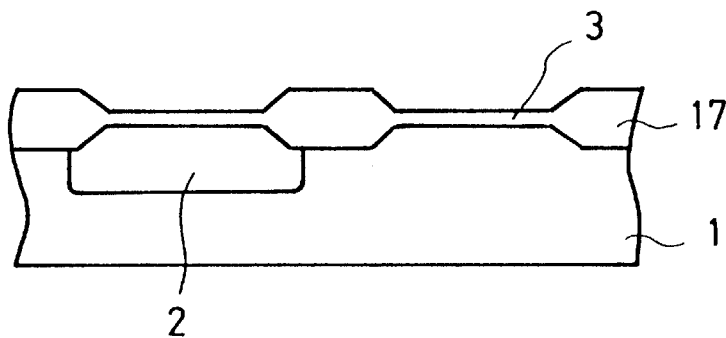
Figure 8E:
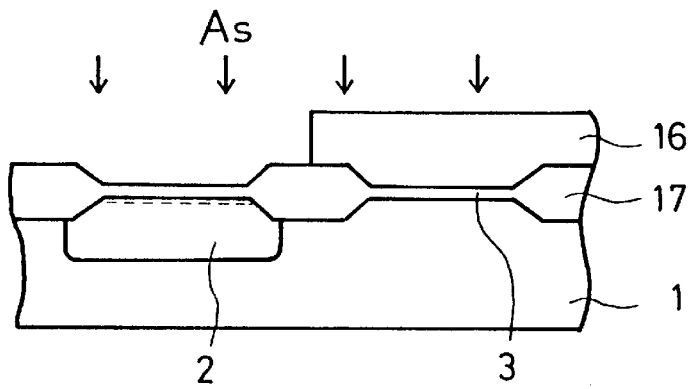
Figure 8F:
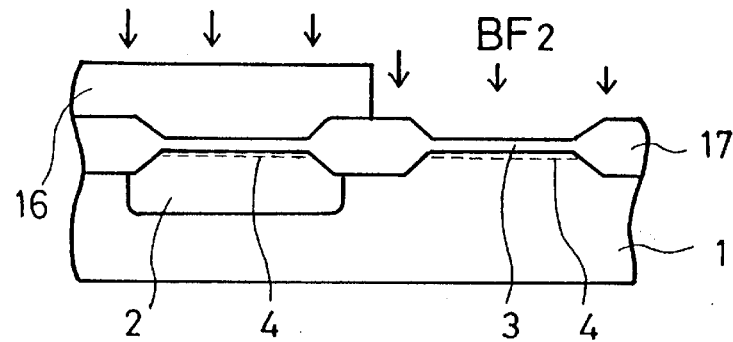
Figure 8G:
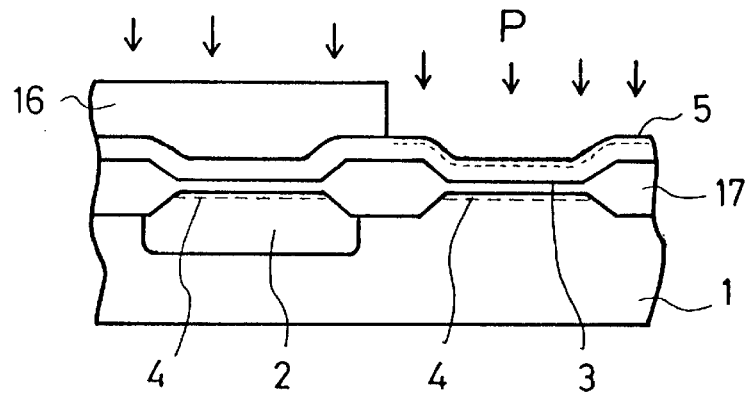
Figure 8H:
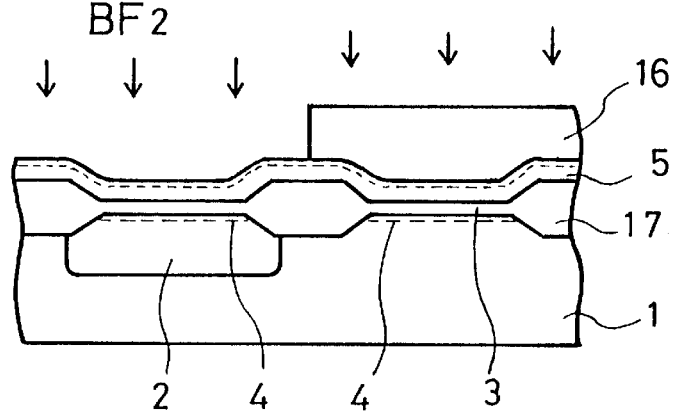
Figure 8I:
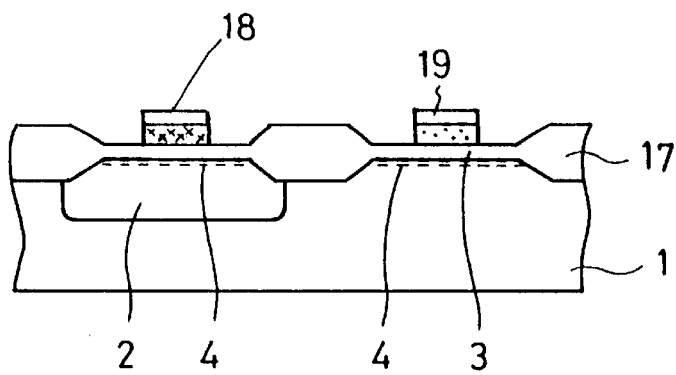
Figure 8J:
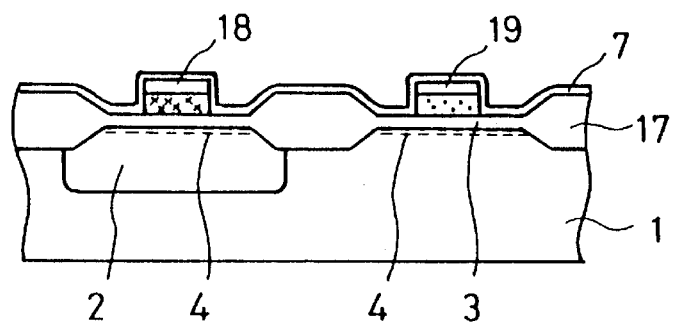
Figure 8K:
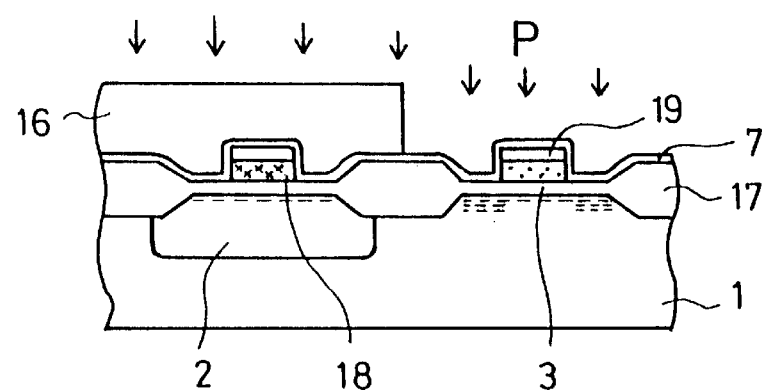
Figure 8L:
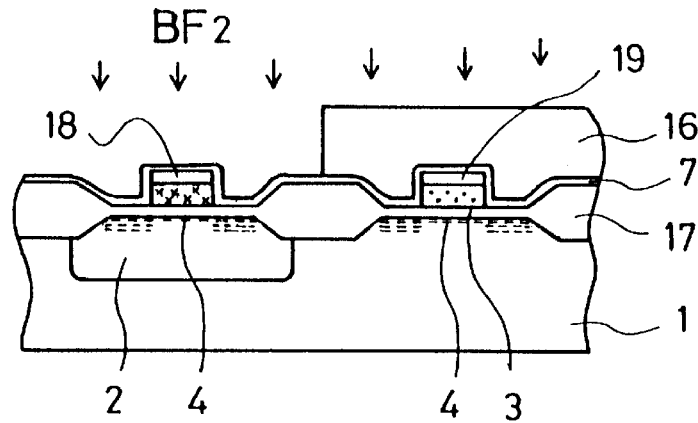

In the next step B, the BF$_2$-doped region over which the N-channel MOS transistor is to be formed is masked with photoresist 16. The channel of the P-channel MOS transistor is doped. That is, N-type impurity phosphorus is implanted. At this time, the previously formed P-type region is converted into an N-type channel layer. In this method, as indicated in FIG. 8F, when the channel of the N-channel MOS transistor is doped, it is not necessary to mask the region over which the P-channel MOS transistor is to be formed with photoresist 16. Hence, the process time is shortened. However, if arsenic having a smaller range is used instead of phosphorus, then it is impossible to completely type-convert the previously formed P-type region. As a consequence, the leakage current is increased.

Figure 16A:
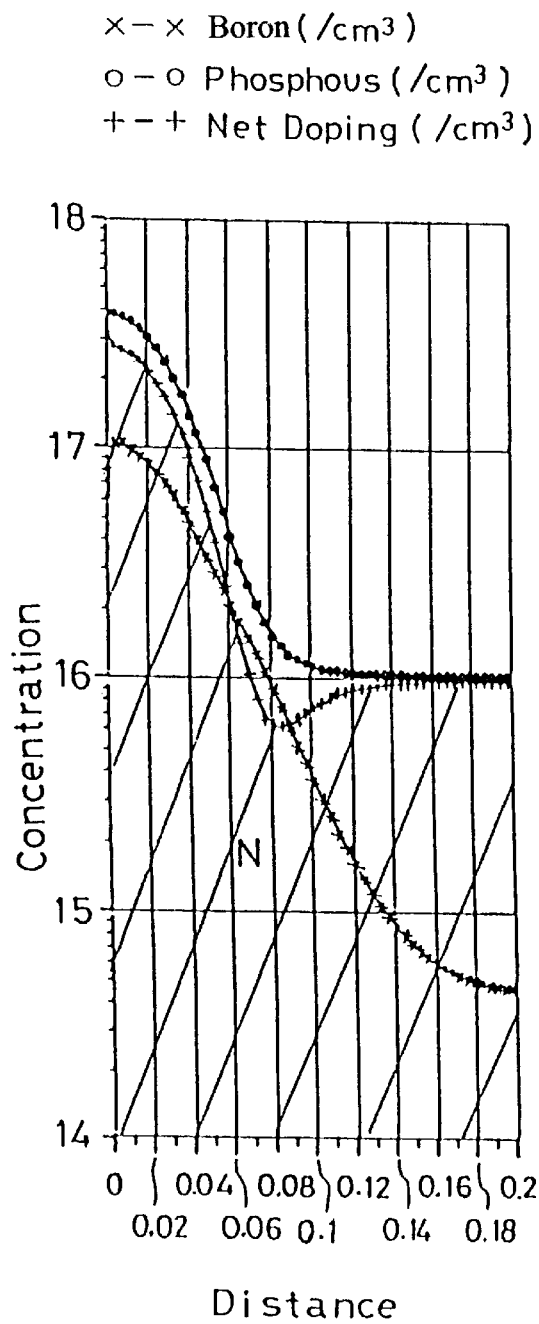
FIGS. 16A and 16B show the impurity profiles of channel doped layers of P-channel MOS transistors.
Figure 16B:
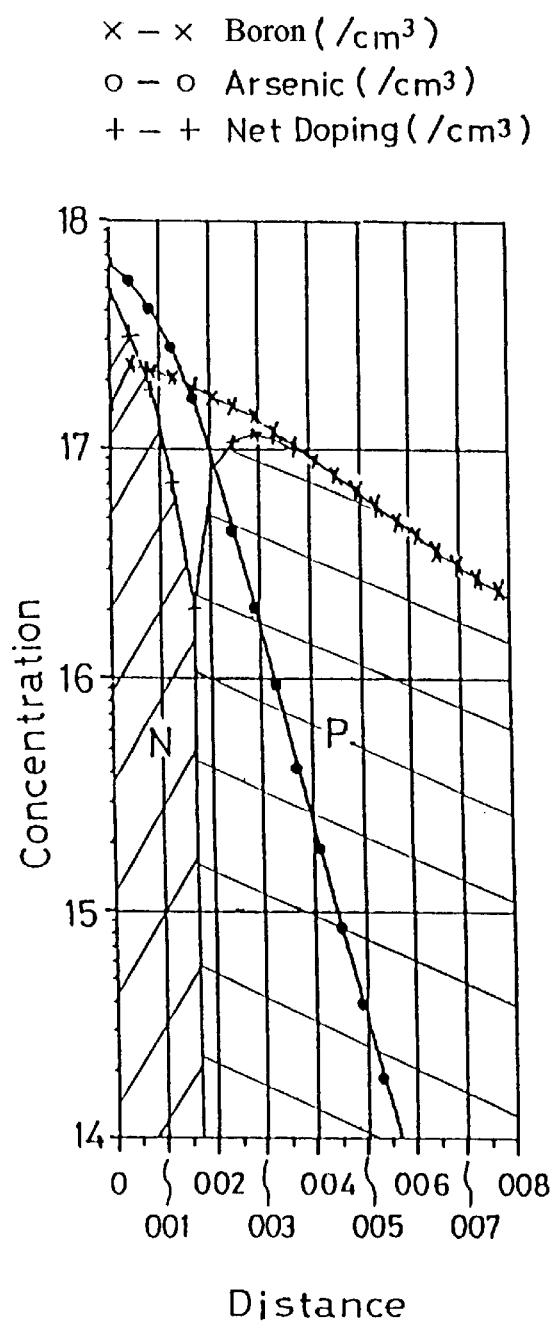

FIGS. 16A and 16B show the impurity profile in the channel implanted layer of the P-channel MOS transistor. The impurity concentration is plotted on the vertical axis of FIGS. 16A and 16B. Distance is plotted on the horizontal axis. FIG. 16A shows the profile when phosphorus is used as an ion-implanted impurity. It can be seen that the channel implanted layer is completely N-type. Where arsenic is used as an impurity (FIG. 16B), a P-type region remains. Conversely, it is possible that, firstly N-type impurity ions are implanted into the whole semiconductor substrate, then the P-channel MOS transistor region is masked with photoresist 16, and then N-type MOS transistor region is conducted with channel doping, manely, the P-type impurity ions of BF$_2$ or boron are implanted into the N-type channel region.

A fifth example of a semiconductor fabrication method according to the present invention is described in detail. Steps for forming the gate electrodes of CMOS transistors of the bipolar polycide gate structure are described by referring to FIGS. 17A to 17D. The steps up to step shown in FIG. 17A are similar to the steps up to step shown in FIG. 8F. In the step shown in FIG. 17A, photoresist 16 formed in the previous step is removed and then polysilicon 5 is deposited by a CVD method on the gate oxide film. Ions of P-type impurity BF$_2$ are implanted into the whole surface of the polysilicon 5. The laminate is heat-treated at a temperature of 700 to 900° C., e.g., 850° C., to activate and diffuse the implanted impurities. In this way, the polysilicon is rendered P-type.

In step shown in FIG. 17B, a tungsten silicide layer is deposited to less than 2000 Å, e.g., 1000 Å, on the polysilicon 5 by a CVD method. Photoresist is patterned. The polysilicon and silicide film are etched at the same timing to form gate electrodes. At this time, the gate electrode over the N well layer 2 over which a P-channel MOS transistor is to be formed and the gate electrode over the region over which an N-channel MOS transistor is to be formed are both P-type polycide gate electrodes 18. Then, the laminate is heat-treated at a temperature of 800 to 1050° C. for a short time in an oxygen ambient. For example, the laminate is heat-treated at about 960° C. for about 45 seconds, thus forming an oxide film 14.

In the next step shown in FIG. 17C, the source/drain regions of the N-channel MOS transistor are formed. At this time, the surface of the N well layer 2 over which the P-channel MOS transistor is to be formed is masked with photoresist 16. Under this condition, ions of an N-type impurity, such as phosphorus, are implanted at an energy of 70 KeV at a dose of 5E15 atoms/cm² by self-alignment using the gate electrodes 18 as a mask. At this time, phosphorus also enters the tungsten silicide.

Figure 7A:
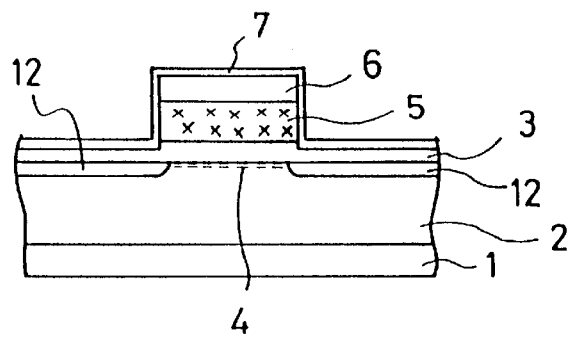
FIGS. 7A to 7D show the process sequence of a fabrication method according to a second example of the invention.
Figure 7B:
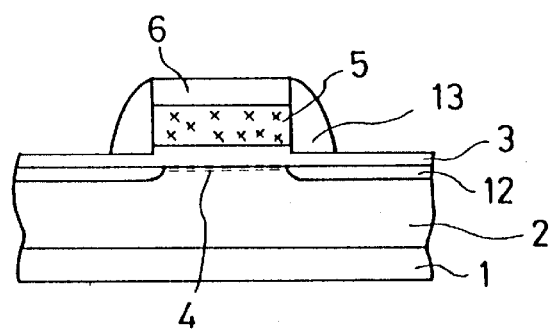
Figure 7C:
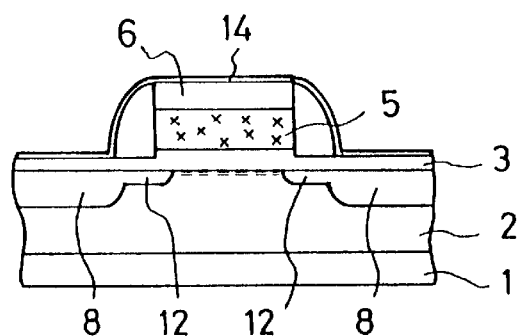
Figure 7D:
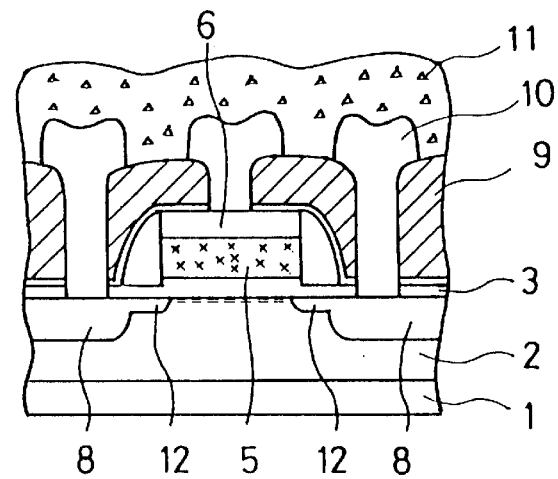

In step shown in FIG. 7D, the source/drain regions of the P-channel MOS transistor are formed. At this time, the previously formed N-channel MOS transistor portion is masked with the photoresist 16. Under this condition, ions of a P-type impurity such as $BF_2$ or boron are implanted by self-alignment using the gate electrodes 18 as a mask. In the present invention, boron is implanted at an energy of 30 KeV at a concentration of 5E15 atoms/cm², or $BF_2$ is implanted at an energy of 80 KeV at 5E15 atoms/cm². Subsequently, the photoresist 16 is removed. An interlayer film 9 of BPSG is formed over the whole surface. This interlayer film 9 is formed, for example, by CVD or other method and subsequently planarized by a heat treatment. In the present invention, a rapid heat treatment (RTA) is made at a temperature of 800 to 1050° C. for a short time. For instance, the laminate is heat-treated at about 1000° C. for 45 seconds. At this time, phosphorus entering the tungsten silicide of the gate electrode during the formation of the source/drain regions of the N-channel MOS transistor is diffused into the underlying polysilicon to convert the P-type polycide gate electrodes into N-type polycide gate electrodes. This heat treatment also serves to activate and diffuse the impurity ions implanted into the source/drain regions. Subsequently, the interlayer film 9 is selectively etched to form contact holes communicating with the source/drain regions and with the gate electrodes. This is followed by contact reflow processing. In the prior art techniques, a heat treatment has been made at 880° C. for about 30 minutes. In the present invention, a heat treatment (RTA) is performed at 850° C. for about 30 seconds. Diffusion of boron into the tungsten silicide is suppressed. Thereafter, a film of a metallic material is formed over the whole surface by vacuum evaporation, sputtering, or other method. Then, a photolithography or etching step is carried out. A metal interconnect pattern 10 is formed. Finally, the whole substrate 1 is coated with a surface-protecting film 11 to fabricate the same structure as shown in FIG. 9.

Where these means are adopted, the masking step for forming the polycide gate electrode can be omitted from the fabrication method described in the third example and so the fabrication process can be shortened.

A sixth example of a semiconductor fabrication method according to the invention is described in detail by referring to FIGS. 18A to 18D. A heat treatment is made at 900° C. to form a thermal oxide film 14 on the surface of a semiconductor substrate 1 of the p⁻-type. A silicon nitride film 15 is formed on the oxide film. Photoresist is patterned, using a P-type well region mask. The silicon nitride film 15 is selectively etched, using the patterned photoresist. Then, P-type impurity boron ions are implanted within a dose range from 1E12/cm² to 5E12/cm². More specifically, the ions are implanted at a dose of 3E12/cm². The regions capped with the silicon nitride film 15 act as an implant mask which prevents boron from being implanted into these regions. Then, a heat treatment is made at 950° C. to grow the thermal oxide film 14 further over the regions where the silicon nitride film 15 are absent. Since the other regions are capped with the silicon nitride film 15, the thermal oxide film 14 does not grow. The implanted impurity boron is diffused and activated. A P well layer 20 is formed. Thereafter, only the remaining silicon nitride film 15 is removed. Ions of an N-type impurity, such as phosphorus, are implanted at a dose of 2E12/cm², for example. Because the thick thermal oxide film 14 is formed on the previously formed P well layer 20, this acts as a mask. Hence, the phosphorus does not enter the P well layer. Then, a heat treatment is made at 1150° C. for 6 hours to diffuse and activate the implanted impurity phosphorus. An N well layer 2 is formed as shown. The previously formed P well layer 20 is heat-treated, and further diffusion is done. An N-channel MOS transistor will be formed on this P well layer 20 and a P-channel MOS transistor will be formed on the N well layer 2 in later steps.

Figure 3:
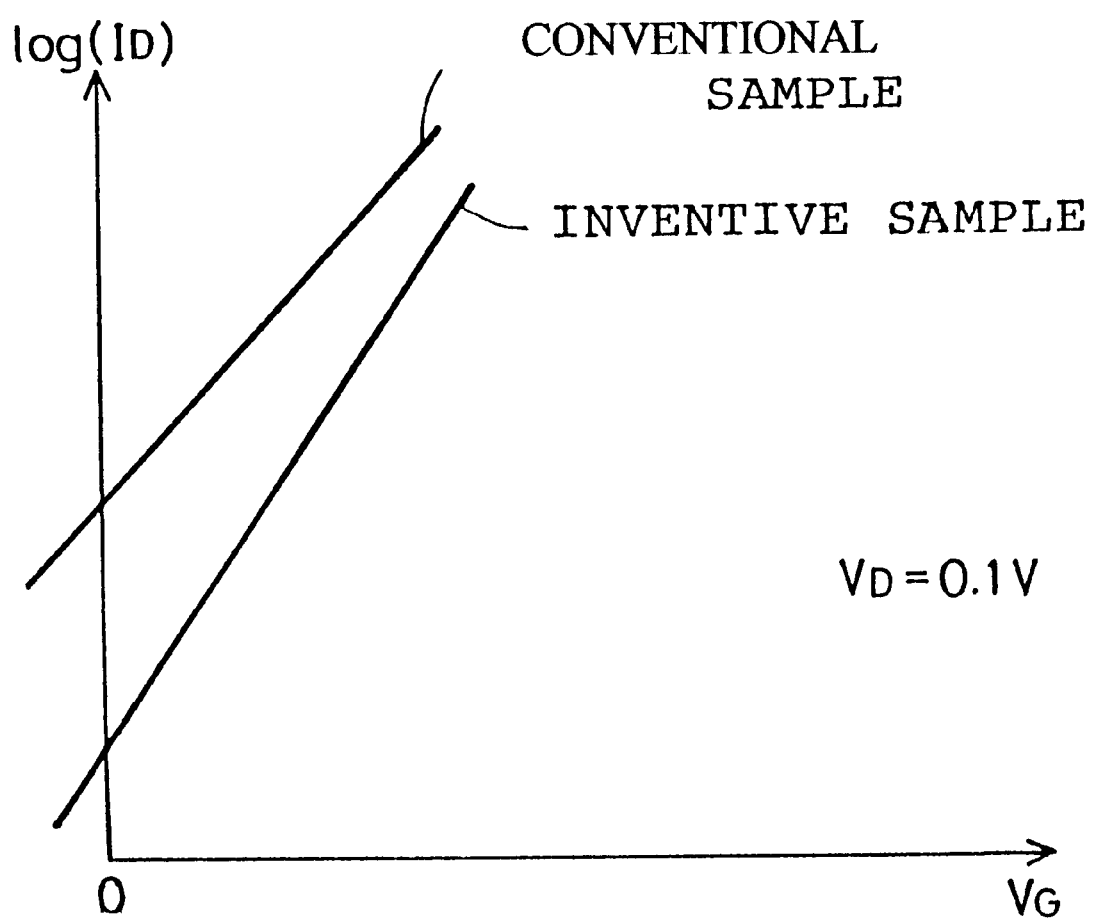
FIG. 3 shows the subthreshold characteristics of MOS transistors.
Figure 19:
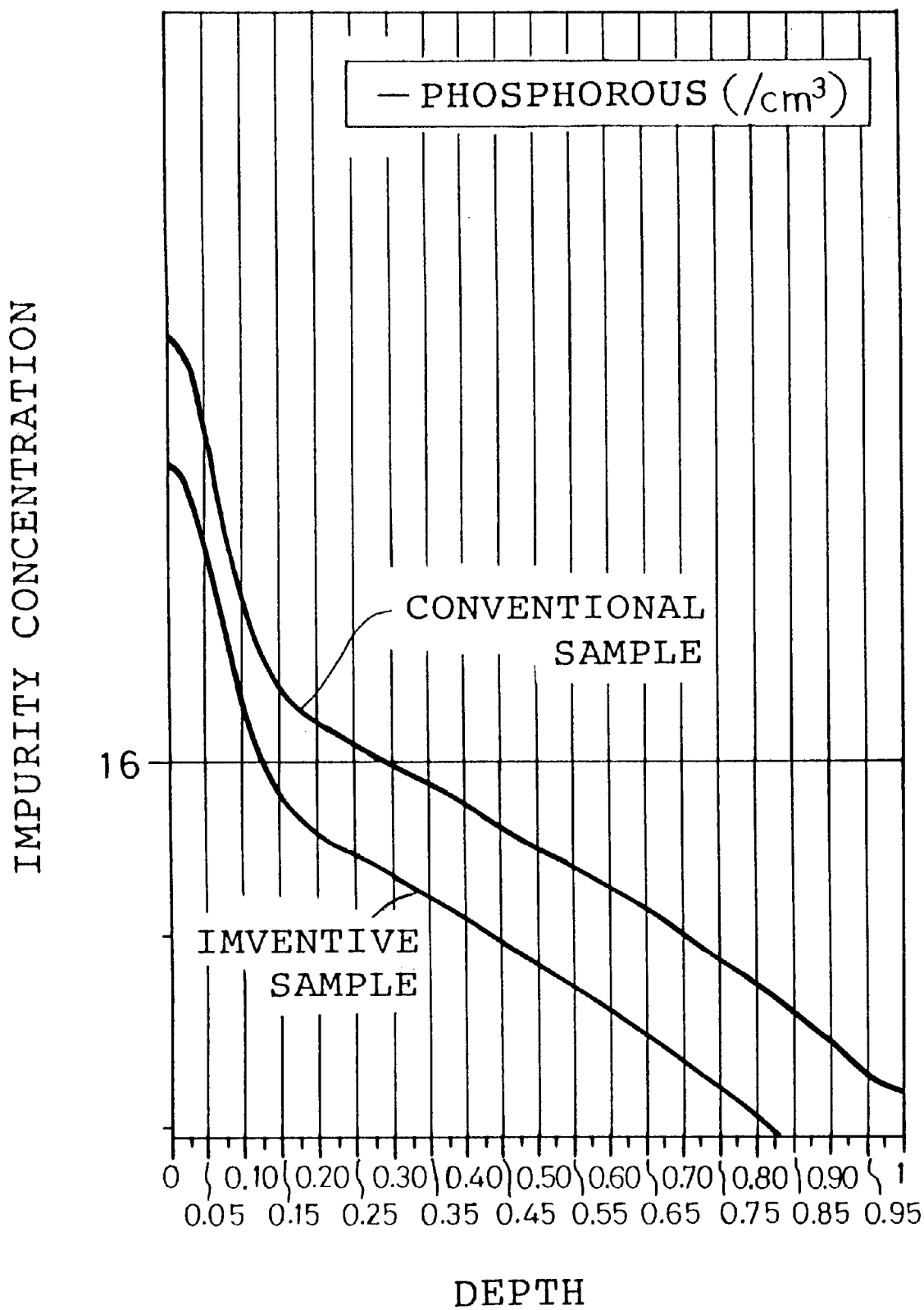
FIG. 19 shows the impurity profiles in N well layers.

FIG. 19 is a graph showing the impurity phosphorus concentration profile in the N well layer taken in the direction of depth, the N well layer being formed in the p⁻-type silicon substrate 1. The impurity concentration is plotted on the vertical axis of the graph, and the depth is on the horizontal axis. The acceleration energy of the implanted ions was 150 KeV. For the novel device, the concentration profile rises near the substrate surface, and the surface concentration is low. On the other hand, for the prior art device, the profile curve rises mildly, and the surface concentration is high. As a result, the inventive device has a lower impurity concentration at the substrate surface. Where the concentration is low, the subthreshold factor S described in connection with FIG. 3 is small. Therefore, the characteristic curve of the inventive device has a small gradient as shown. When the gate voltage VG=0 V, the drain current ID is small. In consequence, the leakage current is small. As a result, high-speed operation is enabled, and low-voltage operation is accomplished.

Examples using a polysilicon thin film as a silicon thin film have been described thus far. A thin film of single-crystal silicon and a thin film of amorphous silicon film can also be employed. The invention is not limited to polysilicon thin films. Furthermore, a P-type silicon substrate is used as a substrate. An N-type silicon substrate may also be used.

In the present invention, no depletion layer exists are inside a gate electrode and so the subthreshold factor S can intent be made small. As a result, the switching performance of the MOS transistor can be improved. Furthermore, increases in the leakage current can be suppressed by lowering the threshold voltage. Hence, high-speed operation and low-voltage operation can be accomplished.

What is claimed is:

1. A method of fabricating a semiconductor device, comprising the steps of:

forming a abate insulating film on a surface of a semiconductor substrate;

forming a polysilicon film on the gate insulating film;

implanting B or $BF_2$ impurity ions into the polysilicon film;

heat-treating the polysilicon film at a temperature of 700–900° C. to activate and diffuse the implanted B or $BF_2$ impurity ions;

forming a silicide film on the heat-treated polysilicon film;

etching the silicide film and the heat-treated polysilicon film to form a gate electrode on the gate insulating film;

forming a CVD-grown dielectric film having a thickness of 5 to 1000 Å over the whole surface of the semiconductor substrate and the gate electrode;

implanting B or $BF_2$ impurity ions into the surface of the semiconductor substrate, using the gate electrode as a mask, to form source/drain regions;

forming a BPSG interlayer film on the CVD-grown dielectric film; and heating the source/drain regions and the BPSG interlayer film at a temperature of 800–1050° C. for a period less than 3 minutes to activate the source/drain regions and to planarize the BPSG interlayer film.

2. A method of fabricating a semiconductor device having N-type semiconductor regions and P-type semiconductor regions formed on a surface of a semiconductor substrate, and P-type insulated-gate field-effect transistors and N-type insulated-gate field-effect transistors disposed at a high integration density in the N-type and P-type semiconductor regions, respectively, the method comprising the steps of:

forming a gate insulating film on the surface of the semiconductor substrate having the P-type and the N-type semiconductor regions;

forming a thin film of silicon on the gate insulating film;

implanting P-type ions of B or $BF_2$ into the thin film of silicon overlying the N-type semiconductor regions;

implanting N-type ions into the thin film of silicon overlying the P-type semiconductor regions;

heat-treating the semiconductor substrate at a temperature of 700–900° C. to make the thin films of silicon P-type and N-type, respectively;

forming a silicide film on the heat-treated thin films of silicon;

selectively etching the thin films of silicon and the silicide film at the same time to form gate electrodes on the gate insulating film;

forming a CVD-grown dielectric film having a thickness of 5 to 1000 Å over the whole surface of the semiconductor substrate and the gate electrodes;

implanting P-type impurity ions into the surfaces of the N-type semiconductor regions while using the gate electrodes as a mask to thereby form source/drain regions;

implanting N-type impurity phosphorus ions into the surfaces of the P-type semiconductor regions while using the gate electrodes as a mask to thereby form source/drain regions;

forming a BPSG interlayer film on the CVD-grown dielectric film; and heat-treating the source/drain regions and the BPSG interlayer film at a temperature of 800–1050° C. for a period less than 3 minutes to activate the source/drain regions and to planarize the BPSG interlayer film.

3. A method of fabricating a CMOS semiconductor device having N-type and P-type semiconductor regions formed on a surface of a semiconductor substrate, and N-type and P-type gate-insulated field-effect transistors disposed at a high integration density in the P-type and N-type semiconductor regions, respectively, the method comprising the steps of:

forming a gate insulating film on the surface of the semiconductor substrate having the N-type and the P-type semiconductor regions;

implanting N-type impurity ions into the surface of the N-type semiconductor region to form a channel doped region;

implanting P-type impurity ions into the surface of the P-type semiconductor region to form a channel doped region;

forming a thin film of silicon on the gate insulating film;

implanting P-type impurity ions of B or $BF_2$ into the thin film of silicon overlying the N-type semiconductor region;

implanting N-type impurity ions into the thin film of silicon overlying the P-type semiconductor region;

heat-treating the semiconductor substrate at a temperature of 700–900° C. to make the thin films of silicon P-type and N-type, respectively;

forming a silicide film on the heat-treated silicon films;

selectively etching the silicon films and the silicide film at the same time to form gate electrodes over the gate insulating film;

forming a CVD-grown dielectric film having a thickness of 5 to 1000 Å over the whole surface of the semiconductor substrate and the gate electrodes;

implanting P-type impurity ions of B or $BF_2$ into the surfaces of the N-type semiconductor regions, using the gate electrodes as a mask, to form source/drain regions;

implanting N-type impurity phosphorus ions into the surfaces of the P-type semiconductor regions, using the gate electrodes as a mask, to form source/drain regions;

forming a BPSG interlayer film on the CVD-grown dielectric film; and heat-treating the source/drain regions at a temperature of 800 to 1050° C. for a period of less than 3 minutes to activate the source/drain regions and to planarize the BPSG interlayer film.

4. A method of fabricating a semiconductor device as set forth in claim 3; wherein during the step of forming the channel doped regions, phosphorus or arsenic ions are implanted as the N-type impurity ions at an acceleration energy of less than 30 KeV or less than 70 KeV, respectively, and $BF_2$ is implanted as the P-type impurity ions at an acceleration energy of less than 70 KeV.

5. A method of fabricating a semiconductor device as set forth in claim 3; wherein during the step of forming the channel doped regions, $BF_2$ ions are implanted as the P-type impurity ions into the whole surface of the semiconductor substrate and then phosphorus ions are implanted as the N-type impurity ions into the surfaces of the N-type semiconductor regions, thereby forming the channel doped regions.

6. A method of fabricating a semiconductor device as set forth in claim 3; wherein during the step of forming the channel doped regions, phosphorus ions are implanted as the N-type impurity ions into the whole surface of the semiconductor substrate and then $BF_2$ ions are implanted as the P-type impurity ions into the surfaces of the P-type semiconductor regions, thereby forming the channel doped regions.

7. A method of fabricating a semiconductor device as set forth in claim 8; wherein the gate insulating film has a thickness of 30 to 200 Å; and wherein the gate electrodes have a minimum length of 10 µm.

8. A method of fabricating a semiconductor device as set forth in claim 4; wherein the gate insulating film has a thickness of 30 to 200 Å; and wherein the gate electrodes have a minimum length of 10 µm.

9. A method of fabricating a semiconductor device as set forth in claim 5; wherein the gate insulating film has a thickness of 30 to 200 Å; and wherein the gate electrodes have a minimum length of 1.0 µm.

10. A method of fabricating a semiconductor device as set forth in claim 6; wherein the gate insulating film has a thickness of 30 to 200 Å; and wherein the gate electrodes have a minimum length of 1.0 µm.

11. A method of fabricating a semiconductor device, comprising the steps of:

forming a gate insulating film on a surface of a semiconductor substrate;

forming a polysilicon film on the gate insulating film;

implanting B or BF$_2$ impurity ions into the polysilicon film;

heat-treating the polysilicon film at a temperature of 700–900° C. to activate and diffuse the implanted B or BF$_2$ impurity ions;

thereafter forming a silicide film on the polysilicon film;

etching the silicide film and the polysilicon film to form a gate electrode on the gate insulating film;

forming a dielectric film over the whole surface of the semiconductor substrate and the gate electrode; and implanting B or BF$_2$ impurity ions into the surface of the semiconductor substrate to form source and drain regions.

12. A method as set forth in claim 11; including the steps of forming a BPSG interlayer film on the dielectric film after the step of forming the source/drain regions, and heating the BPSG interlayer and the source/drain regions at a temperature of 800–1050° C. for a period of less than 3 minutes to activate the source/drain regions and to planarize the BPSG interlayer film.

13. A method as set forth in claim 11; wherein the step of forming the dielectric film comprises forming a CVD-grown dielectric film having a thickness of 5 to 1000 Å.

14. A method of fabricating a semiconductor device as set forth in claim 11; wherein the gate insulating film has a thickness of 30 to 200 Å; and wherein the gate electrode has a minimum length of 1.0 µm.

* * * * *